(12) United States Patent
Hong et al.

(10) Patent No.: US 9,040,173 B2
(45) Date of Patent: May 26, 2015

(54) TRIPHENYLENE-BASED COMPOUNDS AND ORGANIC ELECTROLUMINESCENT DEVICE COMPRISING SAME

(75) Inventors: Jin-Seok Hong, Suwon-si (KR);
Chang-Ju Shin, Yongin-si (KR);
Tae-Hyung Kim, Yongin-si (KR);
Kyoung-Soo Kim, Yuseong-gu (KR)

(73) Assignee: DOOSAN CORPORATION, Seoul (KR)

( * ) Notice: Subject to any disclaimer, the term of this patent is extended or adjusted under 35 U.S.C. 154(b) by 218 days.

(21) Appl. No.: 13/520,100

(22) PCT Filed: Dec. 29, 2010

(86) PCT No.: PCT/KR2010/009503
§ 371 (c)(1),
(2), (4) Date: Sep. 24, 2012

(87) PCT Pub. No.: WO2011/081449
PCT Pub. Date: Jul. 7, 2011

(65) Prior Publication Data
US 2013/0009136 A1    Jan. 10, 2013

(30) Foreign Application Priority Data
Dec. 30, 2009   (KR) .................. 10-2009-0134484

(51) Int. Cl.
*C07D 279/22* (2006.01)
*C07D 417/10* (2006.01)
*C07D 223/22* (2006.01)
*H01L 51/54* (2006.01)
*C09K 11/06* (2006.01)
*H05B 33/14* (2006.01)
*H01L 51/50* (2006.01)

(52) U.S. Cl.
CPC ......... *C09K 11/06* (2013.01); *C09K 2211/1007* (2013.01); *C09K 2211/1011* (2013.01); *C09K 2211/1029* (2013.01); *C09K 2211/1033* (2013.01); *C09K 2211/1037* (2013.01); *C09K 2211/1059* (2013.01); *C09K 2211/1092* (2013.01); *H01L 51/5012* (2013.01); *H05B 33/14* (2013.01)

(58) Field of Classification Search
None
See application file for complete search history.

(56) References Cited

U.S. PATENT DOCUMENTS

2009/0273278 A1* 11/2009 Lee et al. .................. 313/504

FOREIGN PATENT DOCUMENTS

| | | |
|---|---|---|
| JP | 2009-021126 A | 1/2009 |
| JP | 2009-114068 A | 5/2009 |
| JP | 2009-188136 A | 8/2009 |
| JP | 2009-229619 A | 10/2009 |
| JP | 2009-292807 A | 12/2009 |
| KR | 10-2003-0075804 A | 9/2003 |
| KR | 10-2008-0036631 A | 4/2008 |
| KR | 10-2008-0051163 A | 6/2008 |
| KR | 10-2009-0058564 A | 6/2009 |

OTHER PUBLICATIONS

Japanese Patent Office, Communication dated Dec. 6, 2013 issued in the corresponding Japanese Application No. 2012-547024.

* cited by examiner

*Primary Examiner* — J. L. Yang
(74) *Attorney, Agent, or Firm* — Sughrue Mion, PLLC

(57) ABSTRACT

The present invention relates to a triphenylene-based compound represented by the following Formula 1 and an organic electroluminescent device including the same, and the compound of the present invention has excellent hole injection and/or transporting ability, electron transporting ability, and/or light emitting ability, and particularly, green and red light emitting ability, and thus in an organic electroluminescent device containing the same as a light emitting host material, characteristics such as luminous efficiency, luminance, thermal stability, driving voltage, service life and the like may be improved.

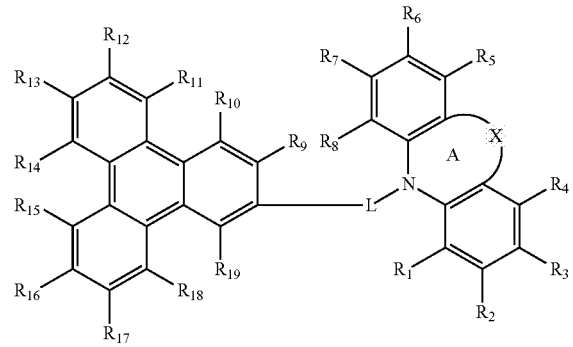

<Formula 1>

In the formula,
each of A, L, X and $R_1$ to $R_{19}$ is the same as those as defined in Detailed Description.

8 Claims, No Drawings

TRIPHENYLENE-BASED COMPOUNDS AND ORGANIC ELECTROLUMINESCENT DEVICE COMPRISING SAME

This application is a National Stage of International Application No. PCT/KR2010/009503 filed Dec. 29, 2010, claiming priority based on Korean Patent Application No. 10-2009-0134484 filed Dec. 30, 2009, the contents of all of which are incorporated herein by reference in their entirety.

TECHNICAL FIELD

The present invention relates to a novel triphenylene-based compound having excellent electron transporting ability, hole injection and transporting ability and light emitting ability, and an organic electroluminescent device of which characteristics such as luminous efficiency, luminance, thermal stability, driving voltage, service life and the like are improved by including the compound in one or more organic layers.

BACKGROUND ART

In the study on organic electroluminescent (EL) devices (hereinafter, simply referred to as an 'organic EL device') from the start point of observation of an organic thin film luminescence by Bernanose in the 1950s subsequent to blue electroluminescence using anthracene single crystals in 1965, an organic EL device having a layered structure which is divided into functional layers such as a hole layer and a light emitting layer was suggested by Tang in 1987, and development has been made toward introducing each characteristic organic layer into a device in order to manufacture an organic EL device with high efficiency and long service life, thereby leading to the development of specialized materials used.

The organic EL device is composed of an indium tin oxide (ITO) substrate, an anode, a hole injection layer selectively receiving holes from the anode, a hole transporting layer selectively transporting holes, a light emitting layer emitting light through recombination of holes and electrons, an electron transporting layer selectively transporting electrons, an electron injection layer selectively receiving electrons from a cathode and the cathode.

In a typical organic EL device, when electric energy is applied to the device, holes from an anode and electrons from a cathode are injected into organic material layers through each functional layer between the anode and the cathode. The device is operated base on the principle that when the injected holes combine with the injected electrons, excitons are formed, and then, when the exciton falls to the ground state again, light is emitted.

The organic EL device is manufactured into a multilayered structure because the transporting speeds of holes and electrons are different from each other, and if a hole injection layer, a hole transporting layer, an electron transporting layer and an electron injection layer are properly prepared, holes and electrons may be effectively transported and the balance between holes and electrons in the device may be achieved, thereby enhancing luminous efficiency.

Electrons injected from the electron injection layer and holes transported from the hole injection layer recombine in the light emitting layer to form an exciton, and the luminescence resulting from the exciton falling from the singlet excited state to the ground state refers to fluorescence, and the luminescence resulting from exciton falling from the triplet excited state to the ground state refers to phosphorescence. When carriers recombine in the light emitting layer to generate excitons, singlet and triplet excitons are generated theoretically in a ratio of 1:3, and when phosphorescence is used, the internal quantum efficiency may reach 100%.

In general, as a phosphorescent host material, a carbazole-based compound and the like such as 4,4-dicarbazolybiphenyl (CBP) and the like are used, and as a phosphorescent dopant material, a metal-complex compound including heavy atoms such as Ir, Pt and the like is widely used.

However, in the case of CBP as a phosphorescent host material which is currently used, the compound has a low glass transition temperature (Tg) of about 110° C. and easily causes the crystallization in a device, thereby leading to a very short service life of about 150 hours in an organic EL device, which is problematic.

DISCLOSURE

Technical Problem

Therefore, an object of the present invention is to provide a triphenylene-based compound having excellent electron transporting ability, hole injection and/or transporting ability and/or light emitting ability, and an organic EL device of which characteristics such as luminous efficiency, luminance, thermal stability, driving voltage, service life and the like are improved by including the compound in one or more organic layers.

Technical Solution

In order to accomplish the above object, the present invention provides a compound represented by the following Formula 1.

[Formula 1]

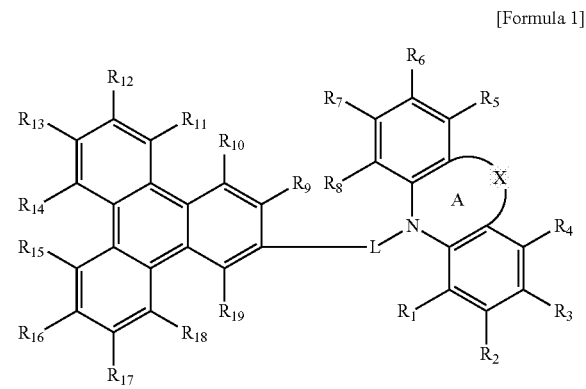

In the formula,

A means an N-containing 6- to 8-membered heterocycle;

X is selected from the group consisting of —(CR$_{20}$R$_{21}$)n-, —(SiR$_{22}$R$_{23}$)m-, —NR$_{24}$—, —O— and —S—, and n and m are each independently an integer of 1 to 3;

R$_1$ to R$_{24}$ are each independently hydrogen, deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted (C7 to C40 aryl)C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted (C7 to C40 aryl)C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and $R_1$ to $R_{23}$ may be bonded with a group adjacent to each other to form a fused aliphatic ring, a fused aromatic ring, a fused heteroaliphatic ring or a fused heteroaromatic ring; and L is a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 60 nuclear atoms, a substituted or unsubstituted C6 to C40 aryloxy, a substituted or unsubstituted (C7 to C40 aryl)C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted (C7 to C40 aryl)C1 to C40 alkylamino, a substituted or unsubstituted C3 to C20 alkylsilyl, a substituted or unsubstituted C8 to C40 arylsilyl, a substituted or unsubstituted C7 to C40 ketoaryl, or a substituted or unsubstituted C1 to C40 haloalkyl.

Further, the present invention provides an organic EL device including an anode; a cathode; and one or more organic layers interposed between the anode and the cathode, in which at least one of the organic layers includes the above-described compound.

Advantageous Effects

The triphenylene-based compound of the present invention has a wide energy band and a larger molecular weight than the molecular weight of 4,4-dicarbazolybiphenyl (CBP) used in the related art, and accordingly, the glass transition temperature is increased and thus excellent thermal stability may be expected. In addition, due to an asymmetric molecular structure, a steric hindrance is formed and crystallinity may be disturbed, and thus extremely excellent performance may be shown in terms of service life. Furthermore, when the above-described compound is adopted as a blue, green and/or red phosphorescent host material or fluorescent host material of an organic EL device, extremely excellent improvement in performance in terms of efficiency and service life may be obtained, compared to CBP. Therefore, the organic EL device including the compound of the present invention may be significantly improved in terms of luminous performance and service life and thus may be effectively applied to a full-color display panel and the like.

BEST MODE

The present invention provides a compound represented by Formula 1, and specifically, a triphenylene-based compound. In the triphenylene-based compound, a N-containing heterocyclic moiety is linked to a triphenylene moiety which does not sufficiently exhibit characteristics as a phosphorescent host due to the improper triplet energy level thereof, through a linker (L), thereby achieving a sufficiently high triplet energy level. It can result in improving phosphorescence characteristics, and simultaneously, electron and/or hole transporting ability, luminous efficiency, driving voltage, life span and the like.

In the compound of Formula 1 of the present invention, X is selected from the group consisting of —$(CR_{20}R_{21})n$-, —$(SiR_{22}R_{23})m$-, —$NR_{24}$—, —O— and —S—, and n and m are each independently an integer of 1 to 3, and accordingly, a ring A including X forms a nitrogen-containing 6- to 8-membered heterocycle.

$R_1$ to $R_{24}$ are each independently hydrogen or any substituent, and non-limiting examples of the substituent include deuterium, a halogen, a substituted or unsubstituted C1 to C40 alkyl (preferably, a C1 to C8 alkyl), a substituted or unsubstituted heterocycle having 3 to 40 nuclear atoms (preferably, a heterocycle having 3 to 18 nuclear atoms), a substituted or unsubstituted C1 to C40 alkoxy (preferably, a C1 to C24 alkoxy), a substituted or unsubstituted aromatic hydrocarbon having 6 to 40 nuclear atoms (preferably, an aromatic hydrocarbon having 6 to 24 nuclear atoms), a substituted or unsubstituted C6 to C40 aryloxy (preferably, a C6 to C18 aryloxy), a substituted or unsubstituted (C7 to C40 aryl)C1 to C40 alkyl (preferably, a (C7 to C24 aryl)C1 to C8 alkyl), a substituted or unsubstituted C2 to C40 alkenyl (preferably, a C2 to C24 alkenyl), a substituted or unsubstituted C1 to C40 alkylamino (preferably, a C1 to C24 alkylamino), a substituted or unsubstituted C6 to C40 arylamino (preferably, a C6 to C24 arylamino), a substituted or unsubstituted (C7 to C40 aryl)C1 to C40 alkylamino (preferably, a (C7 to C24 aryl)C1 to C24 alkylamino), a substituted or unsubstituted C3 to C20 alkylsilyl (preferably, a C3 to C8 alkylsilyl), a substituted or unsubstituted C8 to C40 arylsilyl (preferably, a C8 to C24 arylsilyl), a substituted or unsubstituted C7 to C40 ketoaryl (preferably, a C7 to C24 ketoaryl), a substituted or unsubstituted C1 to C40 haloalkyl (preferably, C1 to C8 haloalkyl), cyano and the like.

$R_1$ to $R_{23}$ may be bonded with a group adjacent to each other to form a fused aliphatic ring, a fused aromatic ring, a fused heteroaliphatic ring or a fused heteroaromatic ring, and specifically, an adjacent group of $R_1$ to $R_4$; an adjacent group of $R_5$ to $R_8$; an adjacent group of $R_9$ to $R_{19}$; $R_{20}$ and $R_{21}$; and $R_{22}$ and $R_{23}$ may be bonded with each other to form a fused aliphatic ring, a fused aromatic ring, a fused heteroaliphatic ring or a fused heteroaromatic ring.

The linker L may be selected from a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 60 nuclear atoms, a substituted or unsubstituted C6 to C40 aryloxy, a substituted or unsubstituted (C7 to C40 aryl)C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted (C7 to C40 aryl)C1 to C40 alkylamino, a substituted or unsubstituted C3 to C20 alkylsilyl, a substituted or unsubstituted C8 to C40 arylsilyl, a substituted or unsubstituted C7 to C40 ketoaryl, and a substituted or unsubstituted C1 to C40 haloalkyl.

The alkyl, heterocycle, alkoxy, aromatic hydrocarbon, aryloxy, arylalkyl, alkenyl, alkylamino, arylamino, arylalkylamino, alkylsilyl, arylsilyl, ketoaryl and haloalkyl of R1 to R24 and linker L may be each independently substituted with one or more selected from the group consisting of deuterium, a halogen, a C1 to C40 alkyl, a heterocycle having 3 to 40 nuclear atoms, a C1 to C40 alkoxy, an aromatic hydrocarbon having 6 to 40 nuclear atoms, a C6 to C40 aryloxy, a (C7 to C40 aryl)C1 to C40 alkyl, a C2 to C40 alkenyl, a C1 to C40 alkylamino, a C6 to C40 arylamino, a (C7 to C40 aryl)C1 to C40 alkylamino, a C3 to C20 alkylsilyl, a C8 to C40 arylsilyl, a C7 to C40 ketoaryl, a C1 to C40 haloalkyl and cyano. Further, the substituent groups may be each independently further substituted with a C1 to C40 alkyl, a C6 to C40 aryl, a heteroaryl having 5 to 40 nuclear atoms and the like.

A representative example of the compound represented by Formula 1 of the present invention may be represented by the following Formula 1a, 1b or 1c.

<Formula 1a>

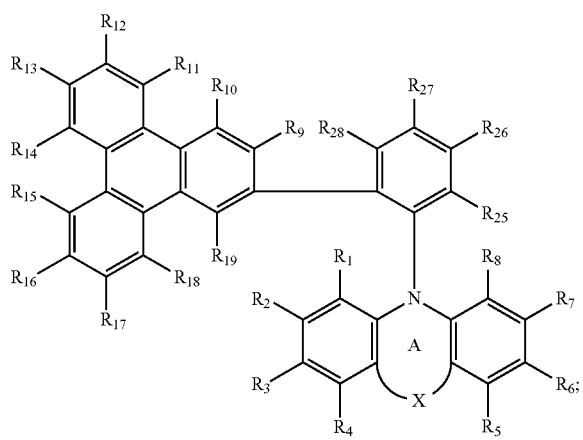

<Formula 1b>

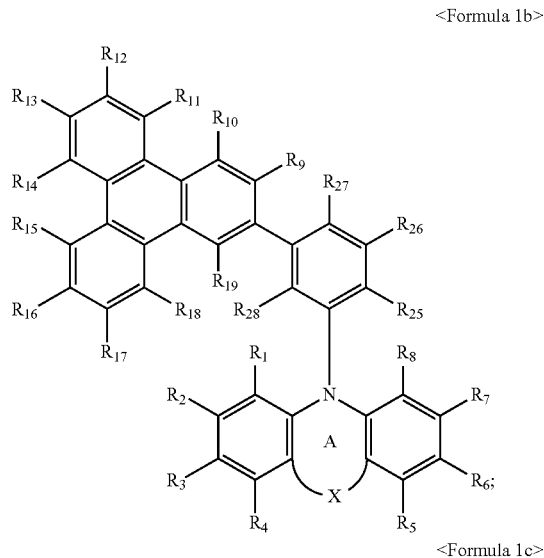

<Formula 1c>

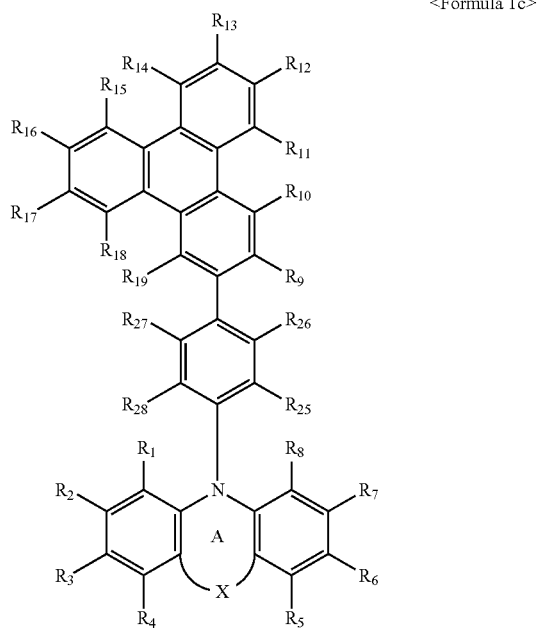

In the formula,
each of A, X and $R_1$ to $R_{19}$ is the same as those as previously defined,
$R_{25}$ to $R_{28}$ are each independently hydrogen, deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted (C7 to C40 aryl)C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted (C7 to C40 aryl)C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and $R_{25}$ to $R_{28}$ may be bonded with a group adjacent to each other to form a fused aliphatic ring, a fused aromatic ring, a fused heteroaliphatic ring or a fused heteroaromatic ring.

The alkyl, heterocycle, alkoxy, aromatic hydrocarbon, aryloxy, arylalkyl, alkenyl, alkylamino, arylamino, arylalkylamino, alkylsilyl, arylsilyl, ketoaryl and haloalkyl of $R_{25}$ to $R_{28}$ may be each independently further substituted with a C1 to C40 alkyl, a C6 to C40 aryl, a heteroaryl having 5 to 40 nuclear atoms and the like.

In addition, the compound represented by Formula 1 of the present invention may be a compound represented by the following Formula 1d.

<Formula 1d>

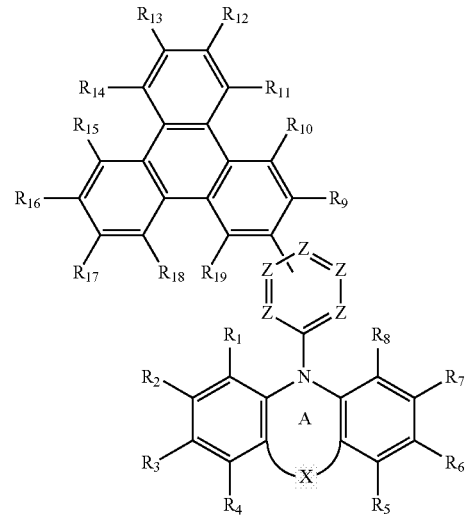

In the formula,
each of X and $R_1$ to $R_{19}$ is the same as those as previously defined, and
at least one of a plurality of Z's is a nitrogen atom and the rest thereof are a carbon atom, a hydrogen atom attached to Z is unsubstituted or at least one thereof is substituted with deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted (C7 to C40 aryl)C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted (C7 to C40 aryl)C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and the substituent groups may be bonded with a group adjacent to each other to form a fused aliphatic ring, a fused aromatic ring, a fused heteroaliphatic ring or a fused heteroaromatic ring.

The substituent groups may be each independently further substituted with a C1 to C40 alkyl, a C6 to C40 aryl, a heteroaryl having 5 to 40 nuclear atoms and the like.

The following formulas are representative examples of the compound represented by Formula 1 of the present invention, but the compound represented by Formula 1 of the present invention is not limited to the following invention.

Inv-1

Inv-2

Inv-3

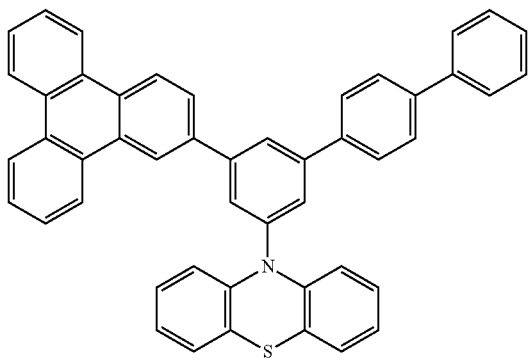

Inv-4

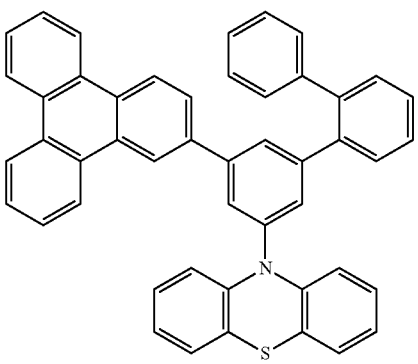

Inv-5

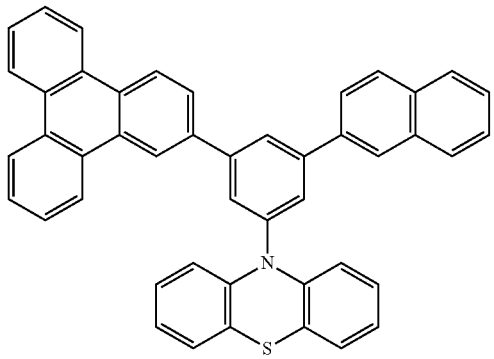

Inv-6

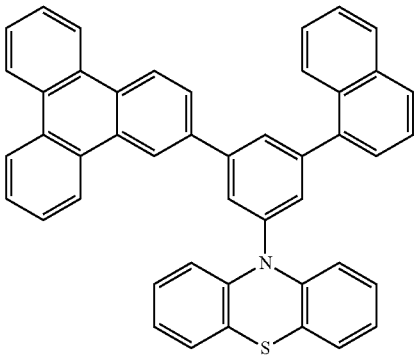

Inv-7

-continued
Inv-8
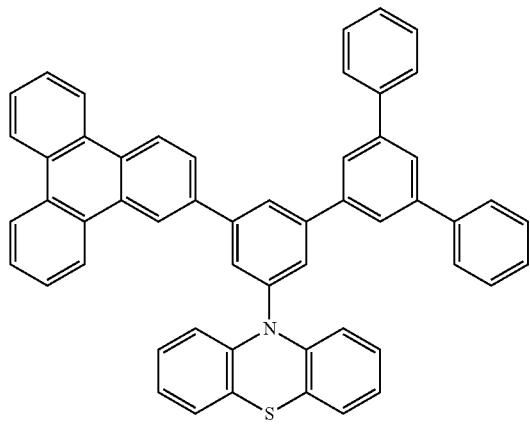
Inv-9
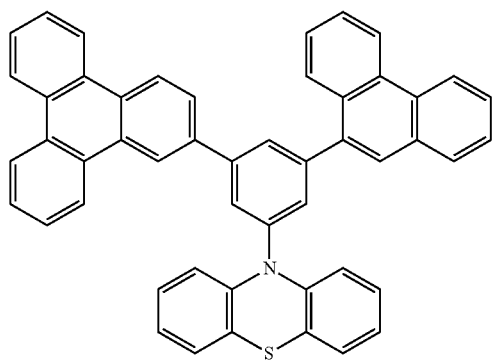
Inv-10
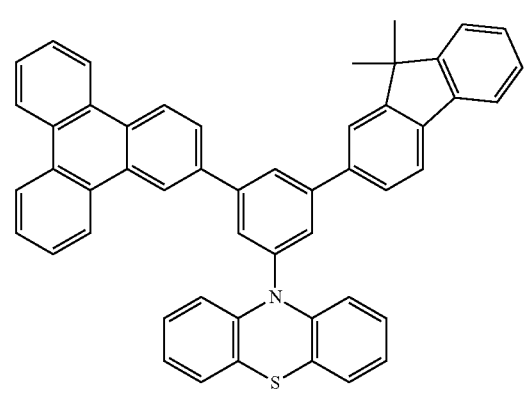
-continued
Inv-11
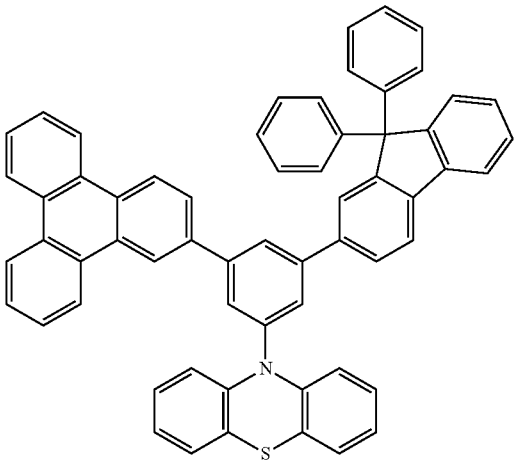
Inv-12
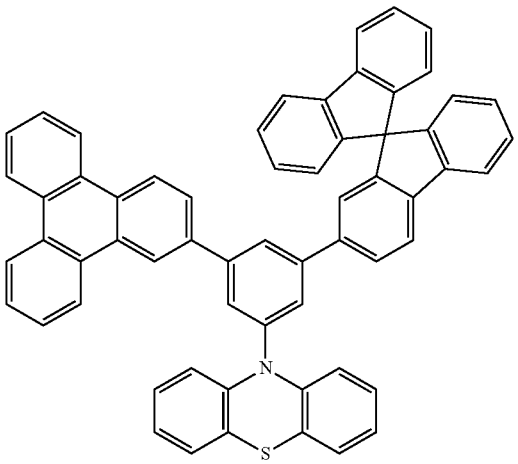
Inv-13
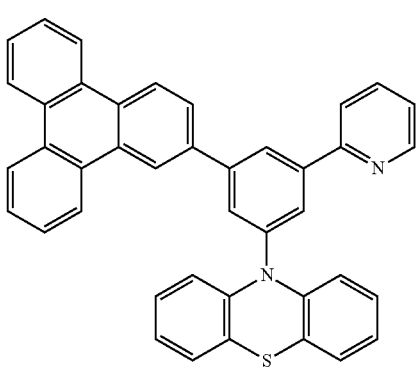

Inv-14
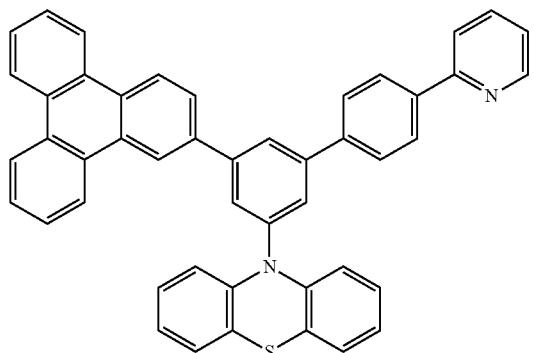
Inv-15
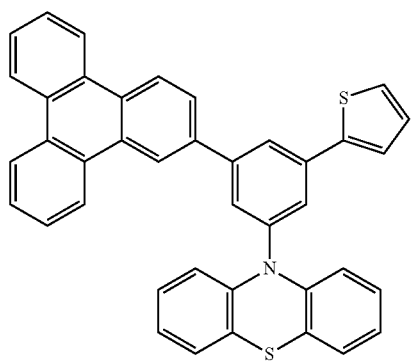
Inv-16
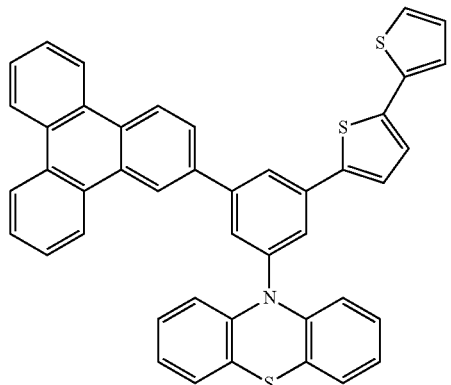
Inv-17
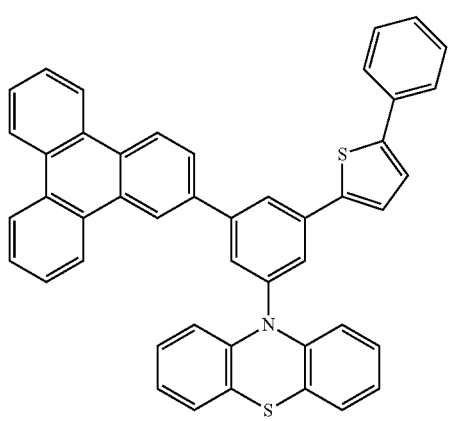
Inv-18
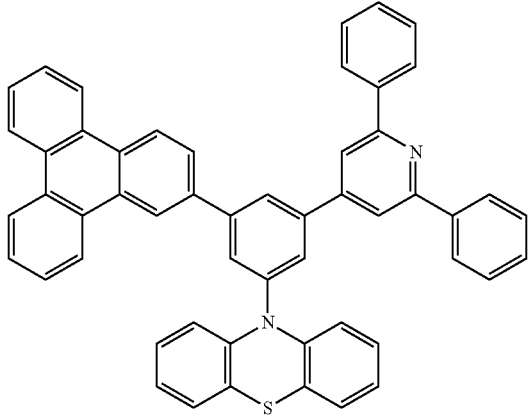
Inv-19
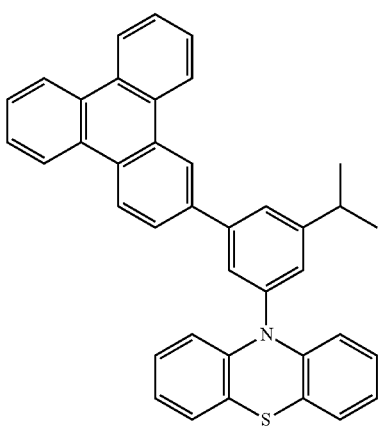
Inv-20
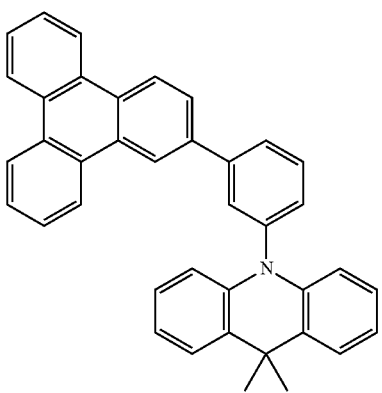

Inv-21
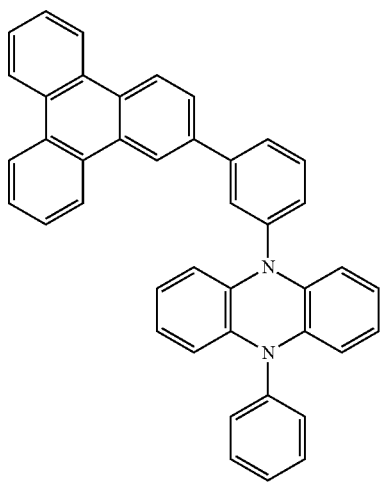
Inv-22
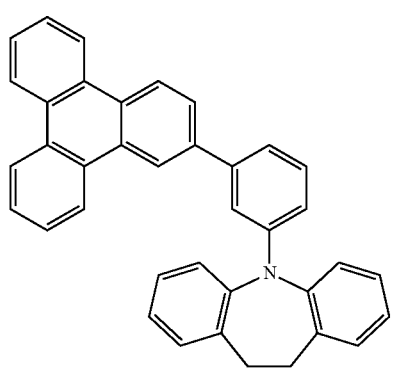
Inv-23
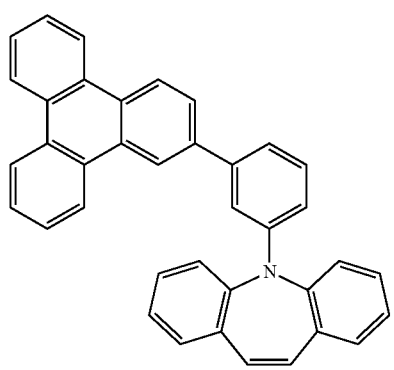
Inv-24
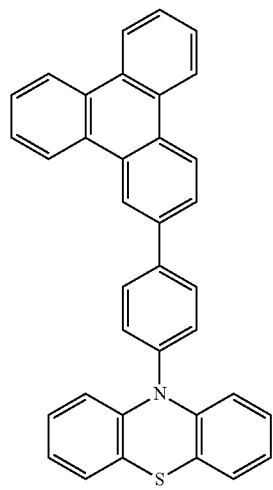
Inv-25
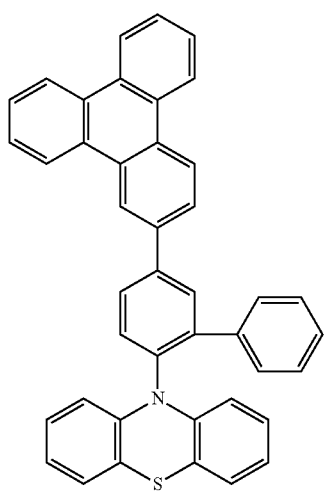
Inv-26
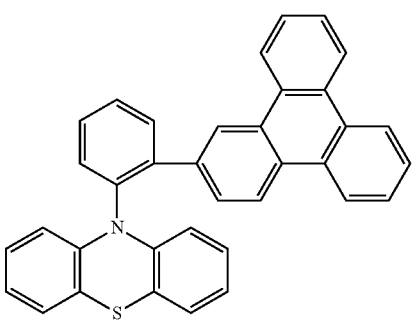
Inv-27
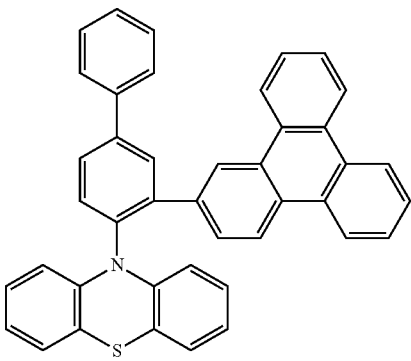

Inv-28
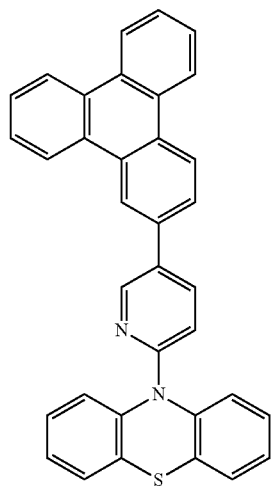
Inv-29
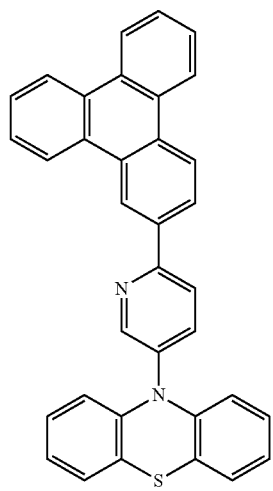
Inv-30
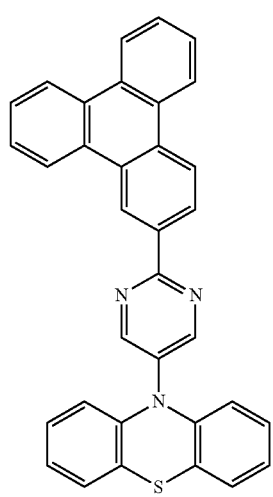
Inv-31
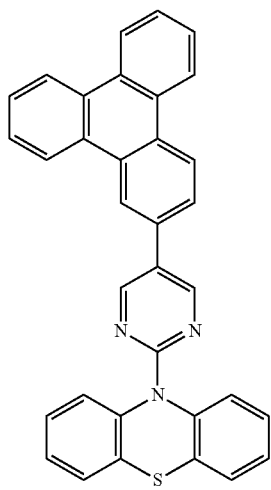
Inv-32
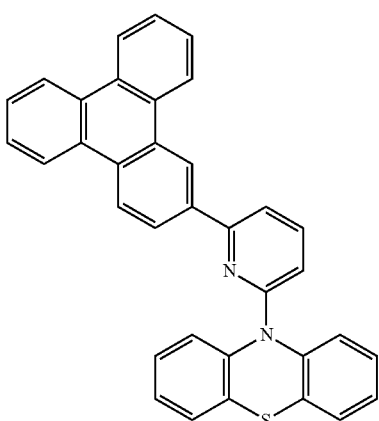
Inv-33
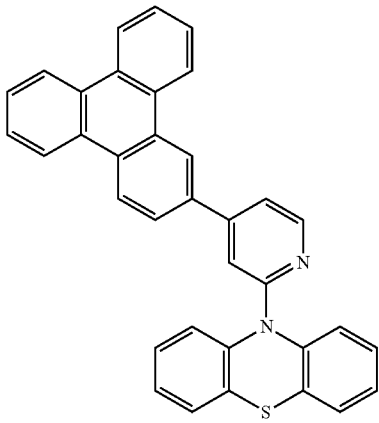

-continued
Inv-34
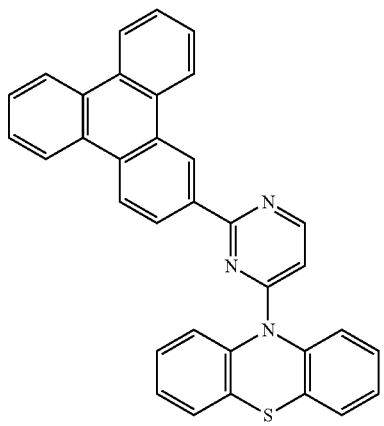
Inv-35
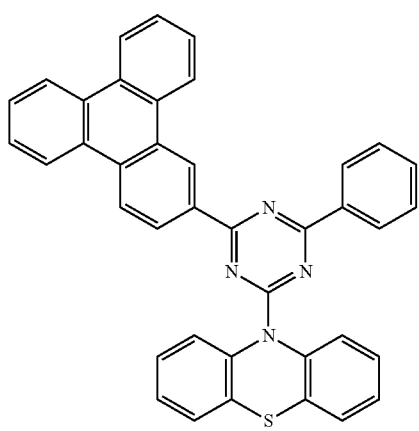
Inv-36
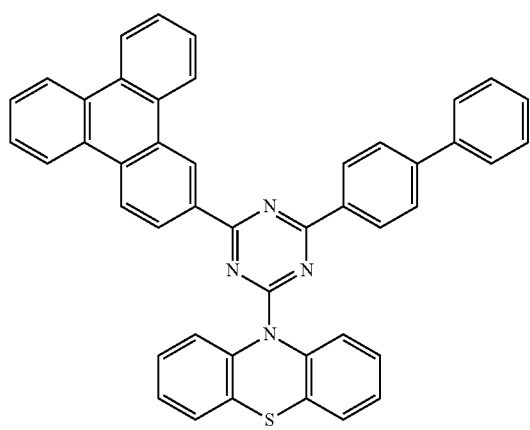
-continued
Inv-37
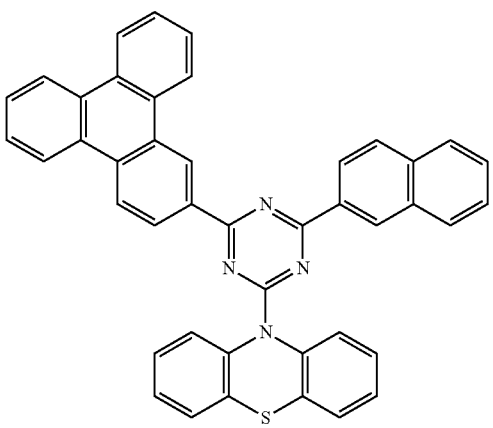
Inv-38
Inv-39
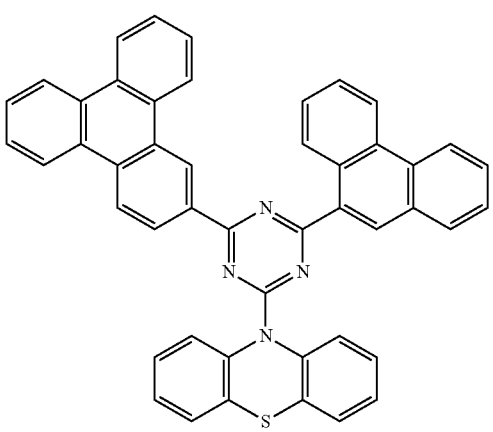

Inv-40
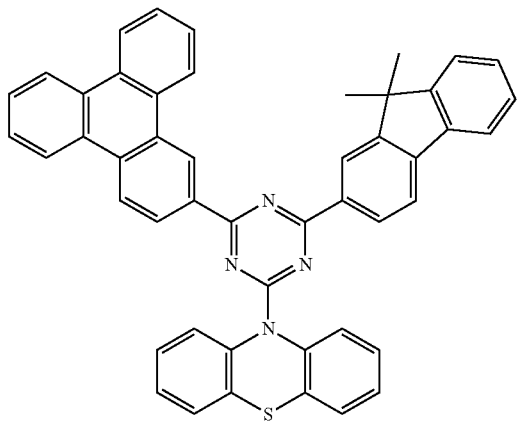
Inv-41
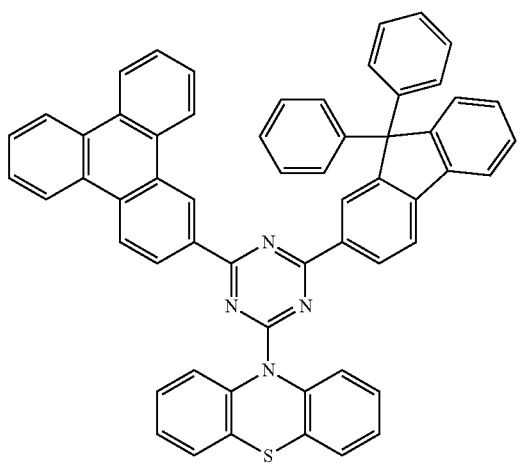
Inv-42
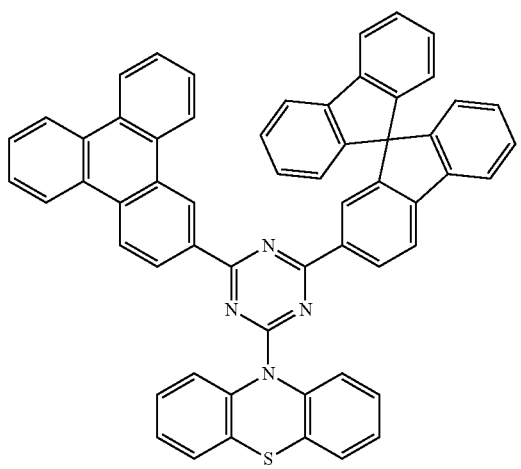
Inv-43
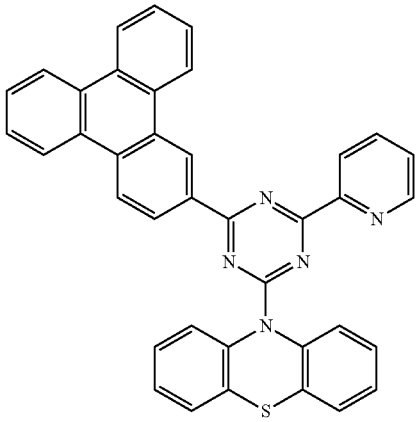
Inv-44
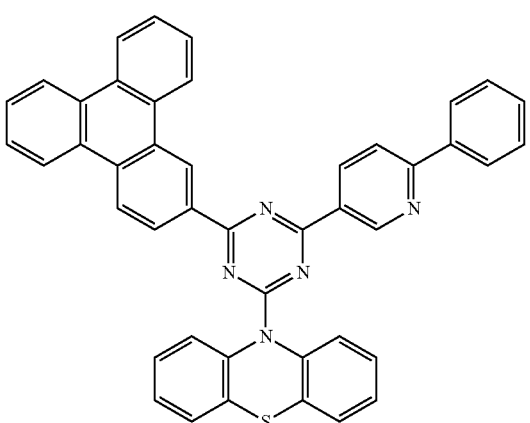
Inv-45
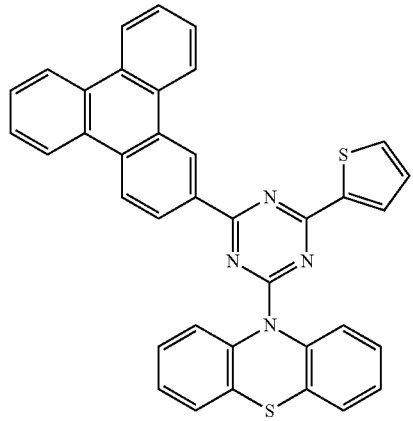

Inv-46
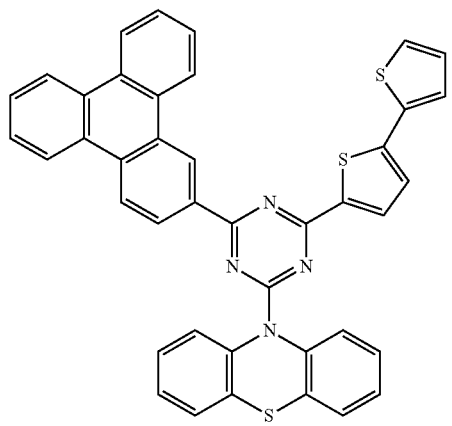
Inv-47
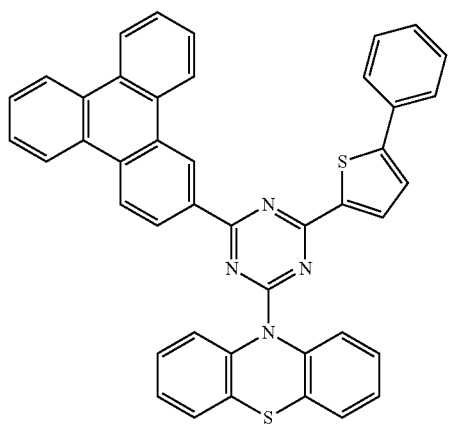
Inv-48
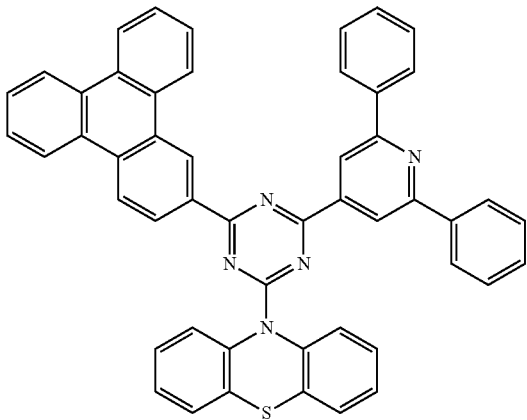
Inv-49
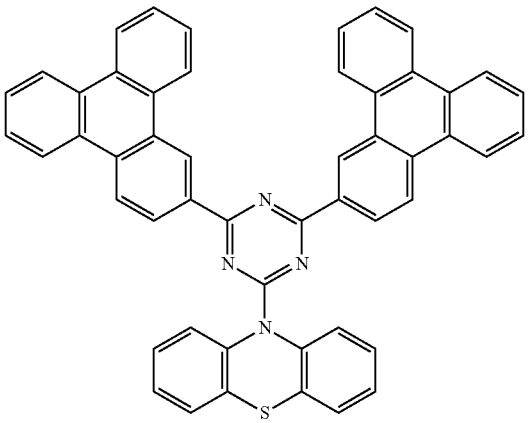
Inv-50
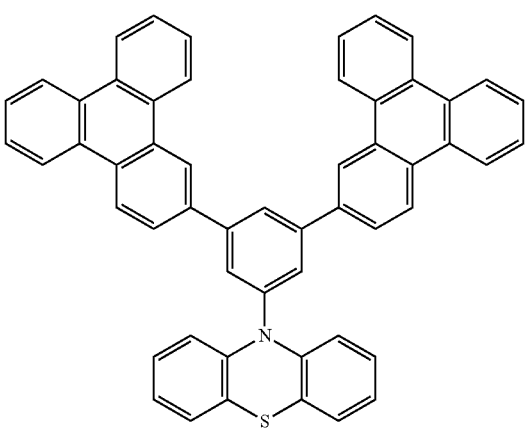
Inv-51
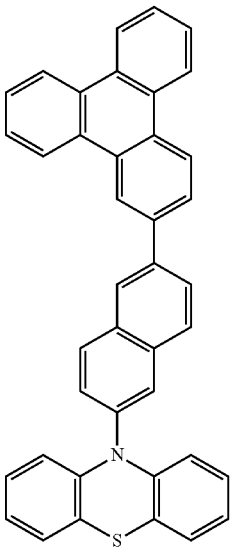

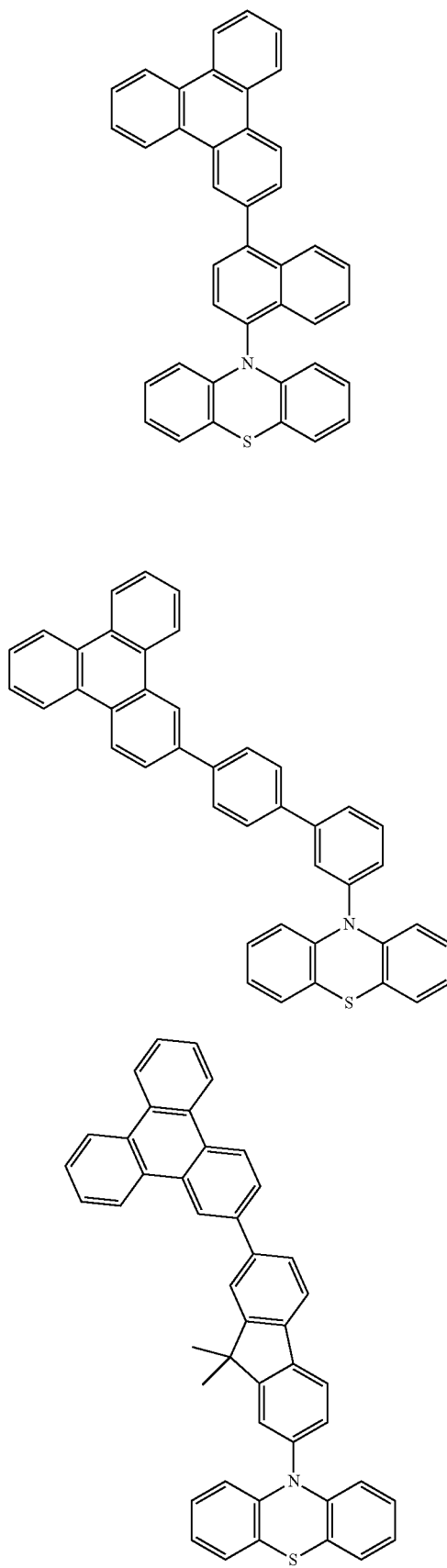
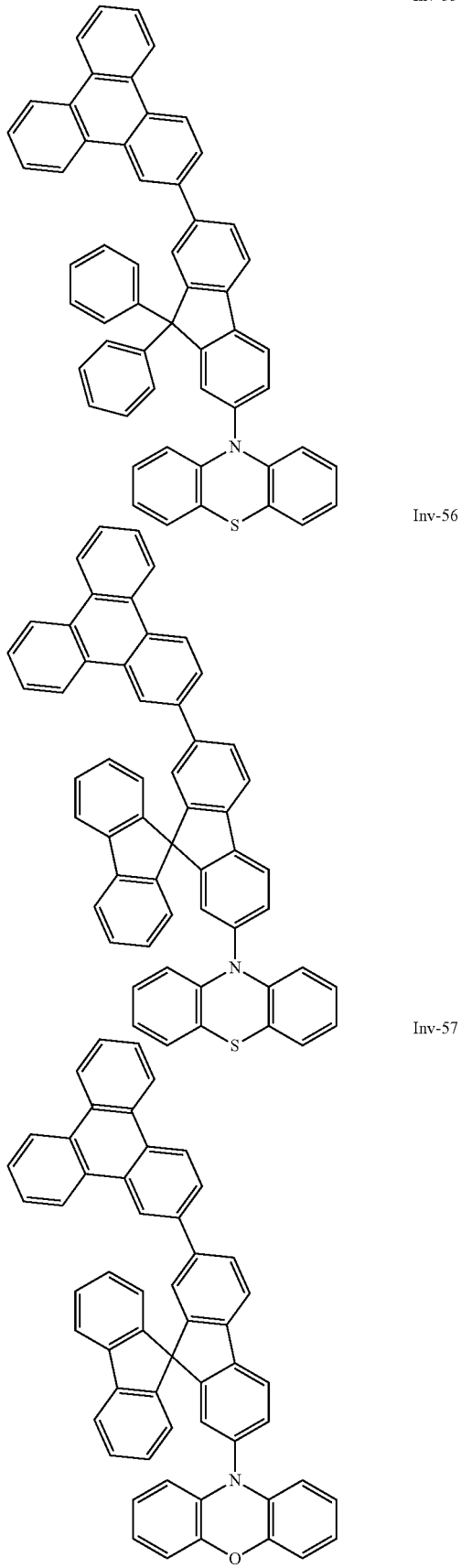

Inv-58
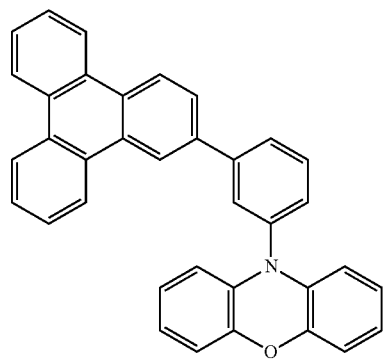
Inv-59
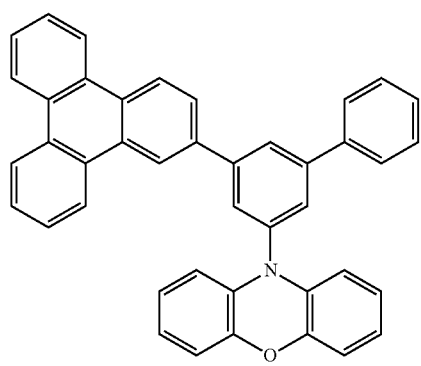
Inv-60
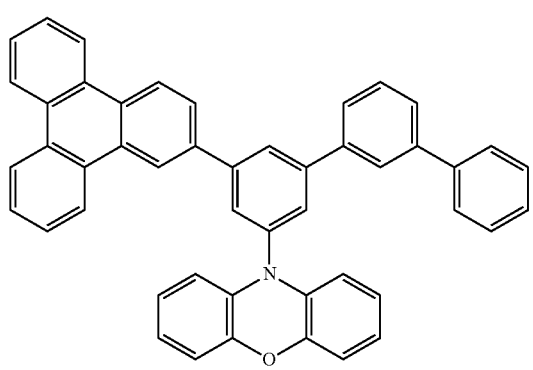
Inv-61
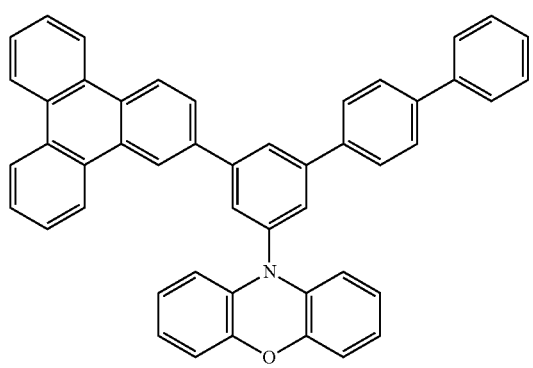
Inv-62
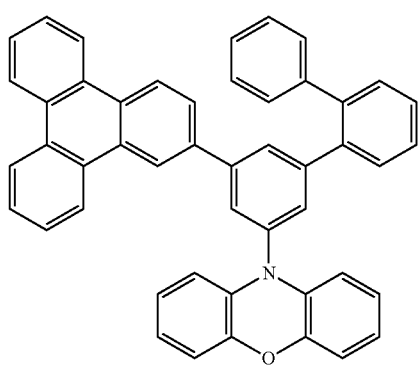
Inv-63
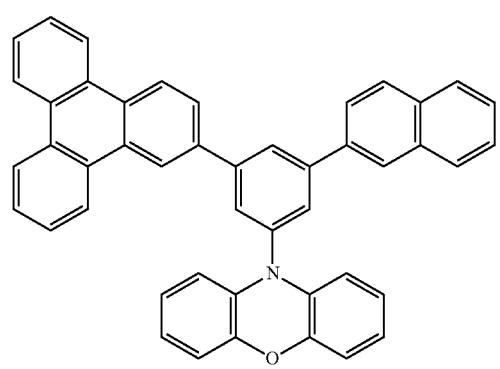
Inv-64
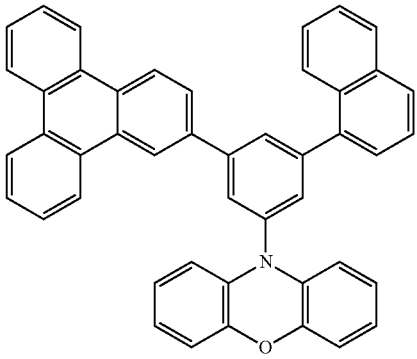
Inv-65
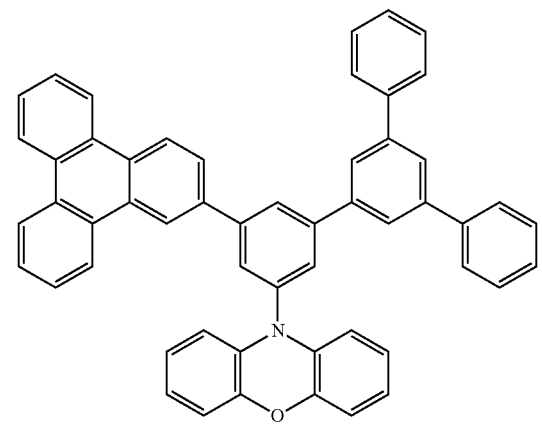

-continued
Inv-66
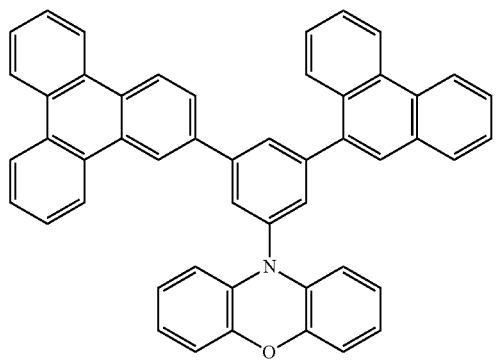
Inv-67
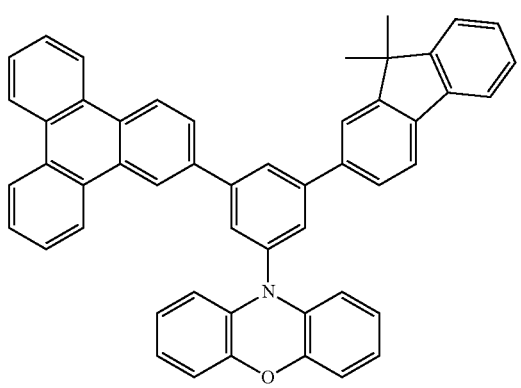
Inv-68
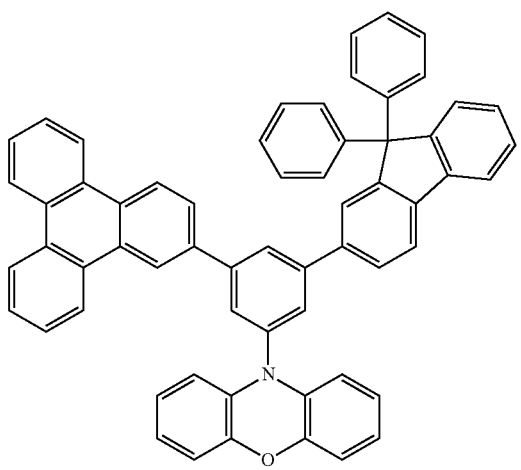
-continued
Inv-69
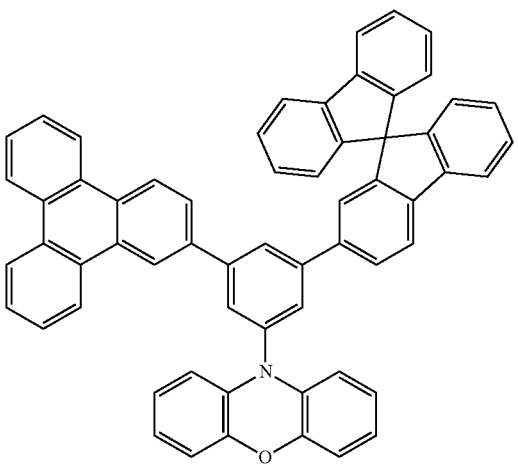
Inv-70
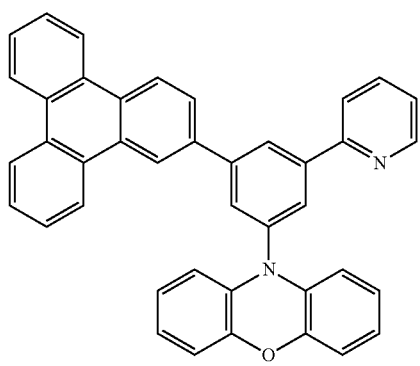
Inv-71
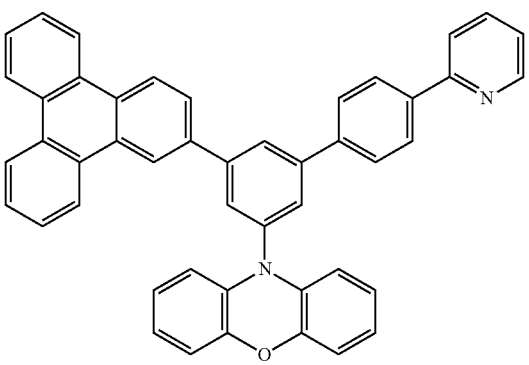
Inv-72
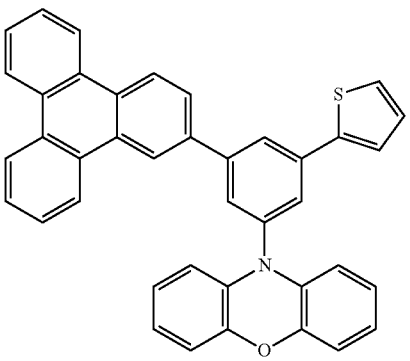

-continued

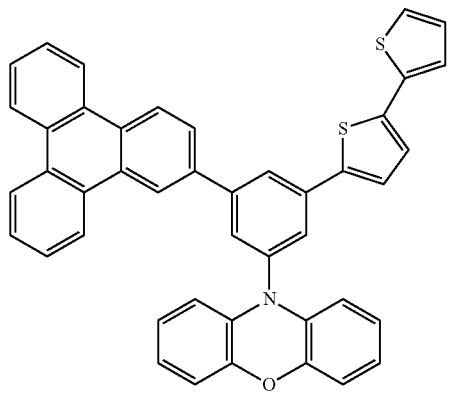

Inv-73

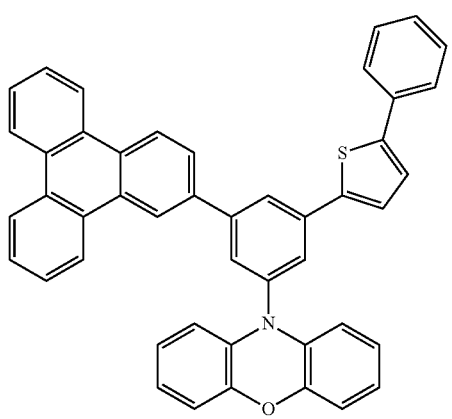

Inv-74

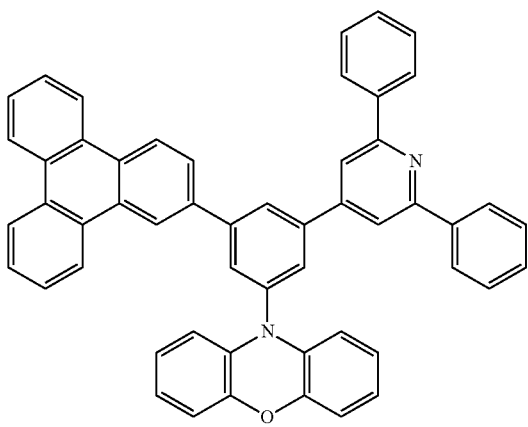

Inv-75

As used herein, the term "unsubstituted heterocycle" means a monoheterocyclic or polyheterocyclic aromatic or non-aromatic ring having 3 to 40 nuclear atoms, and one or more carbons in the ring, preferably 1 to 3 carbons, are substituted with a hetero atom such as N, O, P or S, Non-limiting examples thereof include a heterocycloalkyl such as morpholine and piperazine, a heteroaryl such as indole, and the like. Furthermore, the heterocycle used in the present invention is interpreted as including a condensate (fusion) of an aromatic or non-aromatic heteroatom-containing ring with one or more aromatic or non-aromatic rings.

The term "unsubstituted aromatic hydrocarbon" means an aromatic system having 6 to 60 carbon atoms, in which a single ring or two or more rings are combined. Two or more rings may be simply pendant to each other or pendant to each other in a fused form. Non-limiting examples thereof include an aryl such as phenyl and naphthyl, fluorene and the like.

The compound represented by Formula 1 of the present invention may be synthesized according to a typical synthesis method (for example: Suzuki coupling). The detailed synthesis process of the compound of the present invention will be specifically described in Synthetic Examples to be described below.

The present invention provides an organic EL device including: an anode; a cathode; and one or more organic layers interposed between the anode and the cathode, in which at least one of the one or more organic layers includes the compound represented by Formula 1.

The compound of Formula 1 may be included either alone or in combination thereof, and is preferably the compound represented by Formulas 1a to 1d.

An organic layer including the compound of Formula 1 according to the present invention may be any one or more of a hole injection layer, a hole transporting layer, an electron transporting layer and a light emitting layer. The light emitting layer in the present invention may include a phosphorescent dopant material or a fluorescent dopant material. Preferably, the compound of Formula 1 according to the present invention may be included as a blue, green and/or red phosphorescent host, a fluorescent host, a hole transporting material, a hole injection material or an electron transporting material in an organic EL device. In particular, the compound according to Formula 1 of the present invention may be used as a phosphorescent host.

The compound of present invention has a high glass transition temperature of 150° C. or higher, and when the compound is used as an organic layer of an organic EL device, the crystallization in the organic EL device is minimized, and thus the driving voltage of the device may be reduced and characteristics such as luminous efficiency, luminance intensity, thermal stability and service life may be improved.

Non-limiting examples of an organic EL device structure according to the present invention include a structure in which a substrate, an anode, a hole injection layer, a hole transporting layer, a light emitting layer, an electron transporting layer and a cathode are sequentially laminated, and at this time, one or more of the light emitting layer, hole injection layer, hole transporting layer and electron transporting layer may include the compound represented by Formula 1. An electron injection layer may be positioned on the electron transporting layer.

Further, the organic EL device according to the present invention may include the structure in which an anode, one or more organic layers and a cathode are sequentially laminated as described above and a structure in which an insulation layer or an adhesive layer may be inserted at the interface of the electrode and the organic layer.

In the organic EL device of the present invention, the organic layer including the compound of Formula 1 may be formed by vacuum deposition or solution coating. Examples of the solution coating include spin coating, dip coating, doctor blading, inkjet printing or heat transferring method and the like, but are not limited thereto.

For the organic EL device of the present invention, organic layers and electrodes may be formed by using the material and method known in the art, except that one or more layers of the organic layers are formed so as to include the compound represented by Formula 1 of the present invention.

For example, as a substrate, a silicon wafer, quartz, a glass plate, a metal plate, a plastic film, a plastic sheet or the like may be used.

Examples of an anode material include a metal such as vanadium, chromium, copper, zinc and gold, or an alloy thereof; a metal oxide such as zinc oxide, indium oxide, indium tin oxide (ITO) and indium zinc oxide (IZO); a combination of a metal and an oxide such as ZnO:Al or $SnO_2$:Sb; a conductive polymer such as polythiophene, poly(3-methylthiophene), poly[3,4-(ethylene-1,2-dioxy)thiophene] (PEDT), polypyrrole and polyaniline; or carbon black and the like, but are not limited thereto.

Examples of a cathode material include a metal such as magnesium, calcium, sodium, potassium, titanium, indium, yttrium, lithium, gadolinium, aluminum, silver, tin or lead or an alloy thereof; a multilayer structured material such as LiF/Al or $LiO_2$/Al, and the like, but are not limited thereto.

A hole injection layer, a hole transporting layer and an electron transfer layer and an electron injection layer are not particularly limited, and materials commonly known in the art may be used.

Hereinafter, the present invention will be described in detail through the following Examples. However, the following Examples are only illustrative of the present invention and the present invention is not limited by the following Examples.

Synthetic Example 1

Synthesis of Compound Inv-1 (10-(3-(triphenylen-2-yl)phenyl)-10H-phenothiazine)

<Step 1> Synthesis of 10-(3-bromophenyl)-10H-phenothiazine

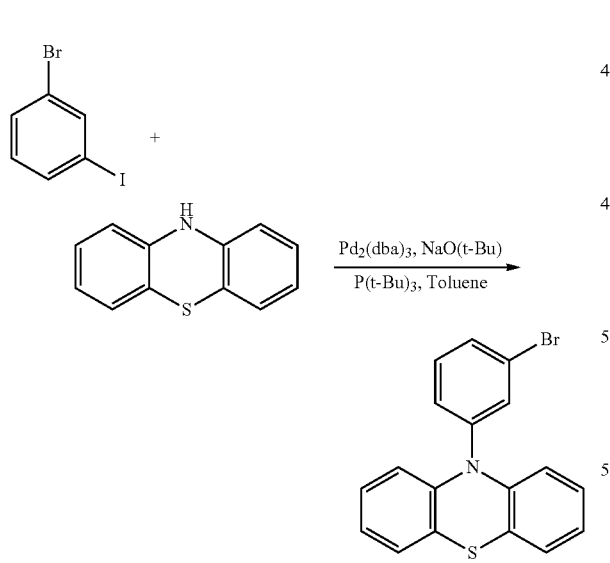

15.35 ml (120.43 mmol) of 1-bromo-3-iodobenzene, 10H-phenothiazine (15.0 g, 75.27 mmol), sodium t-butoxide (21.70 g, 225.81 mmol) and 1.83 ml (7.53 mmol) of tri-t-butylphosphine were dissolved in 400 ml of toluene, $Pd_2(dba)_3$ (1.38 g, 1.51 mmol) was added thereto, and then the mixture was stirred while refluxing for 12 hr.

After the completion of the reaction, the reaction product was extracted with dichloromethane and then purified by silica gel column chromatography (Hexane:MC=4:1 (v/v)) to obtain the title compound (17.3 g, yield 65%).

$^1$H NMR: 6.31 (t, 2H), 6.48 (s, 1H), 6.63 (t, 2H), 6.85 (m, 4H), 6.99 (d, 2H), 7.22 (dd, 1H).

GC-Mass (theoretical value: 352.99 g/mol, measured value: 353 g/mol).

<Step 2> Synthesis of Compound Inv-1

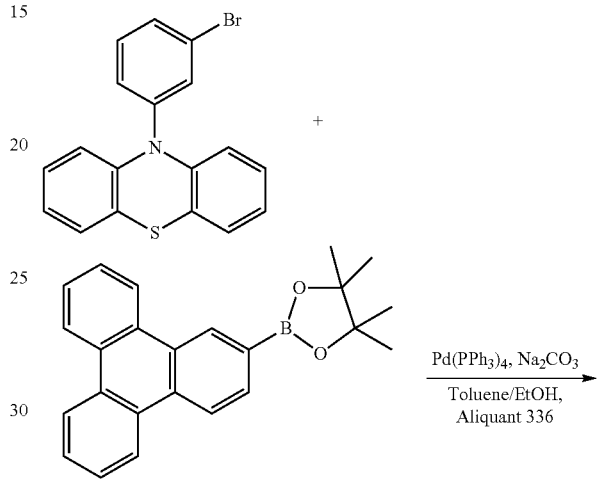

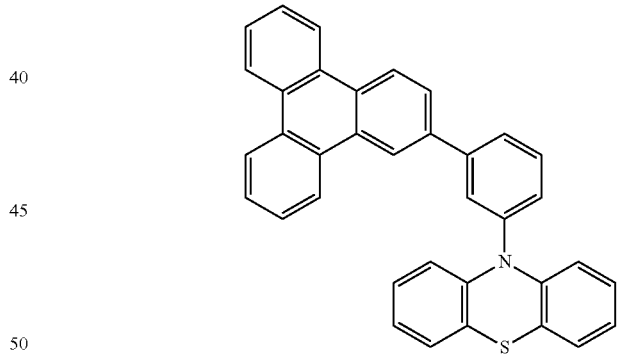

The compound (10 g, 28.33 mmol) synthesized in <Step 1>, 4,4,5,5-tetramethyl-2-(triphenylen-2-yl)-1,3,2-dioxaborolane (11.04 g, 31.16 mmol), $Pd(PPh_3)_4$ (0.65 g, 0.57 mmol) and sodium carbonate (9.01 g, 84.99 mmol) were suspended in a mixed solvent of 300 ml of toluene and 80 ml of ethanol, and then the mixture was stirred while refluxing for 12 hr.

After the completion of the reaction, the reaction product was extracted with dichloromethane and then purified by silica gel column chromatography (Hexane:MC=4:1 (v/v)) to obtain the desired title compound Inv-1 (11.5 g, yield 81%).

$^1$H NMR: 6.67 (m, 4H), 6.90 (t, 2H), 6.98 (m, 5H), 7.01 (s, 1H), 7.87 (m, 4H), 8.01 (d, 1H), 8.11 (m, 3H), 8.89 (t, 2H), 9.11 (s, 1H).

GC-Mass (theoretical value: 501.16 g/mol, measured value: 502 g/mol).

Synthetic Example 2

Synthesis of Compound Inv-9

<Step 1> Synthesis of 10-(3-bromo-5-(phenanthren-9-yl)phenyl)-10H-phenothiazine

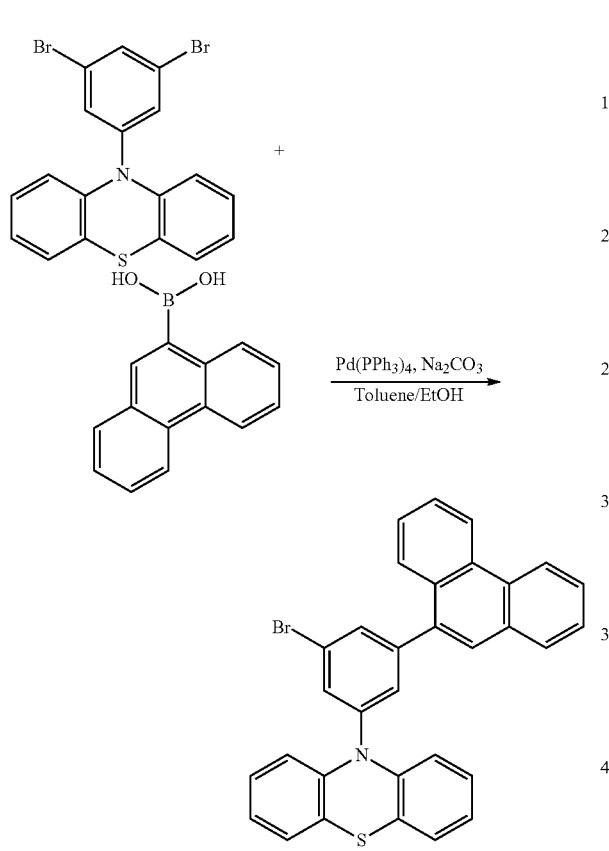

10-(3,5-dibromophenyl)-10H-phenothiazine (15.0 g, 34.81 mmol), phenanthrene-9-yl boronic acid (6.96 g, 31.33 mmol), Pd(PPh$_3$)$_4$ (0.80 g, 0.70 mmol) and sodium carbonate (11.07 g, 104.43 mmol) were suspended in a mixed solvent of 400 ml of toluene and 100 ml of ethanol and then the mixture was stirred while refluxing for 12 hr.

After the completion of the reaction, the reaction product was extracted with dichloromethane and then purified by silica gel column chromatography (Hexane:MC=4:1 (v/v)) to obtain the title compound (12.4 g, yield 75%).

$^1$H NMR: 6.71 (m, 4H), 6.91 (t, 2H), 6.99 (m, 4H), 7.05 (s, 1H), 7.89 (m, 5H), 8.15 (t, 2H), 8.71 (t, 2H).

GC-Mass (theoretical value: 529.05 g/mol, measured value: 530 g/mol).

<Step 2> Synthesis of Compound Inv-9

10.2 g (yield 80%) of the desired title compound Inv-9 was obtained in the same manner as in Synthetic Example 1, except that 10 g (18.90 mmol) of the compound synthesized in <Step 1> was used.

$^1$H NMR: 6.68 (m, 4H), 6.92 (dd, 2H), 7.01 (m, 5H), 7.86 (m, 9H), 8.24 (m, 5H), 8.89 (m, 6H).

GC-Mass (theoretical value: 677.22 g/mol, measured value: 678 g/mol).

Synthetic Example 3

Synthesis of Compound Inv-13

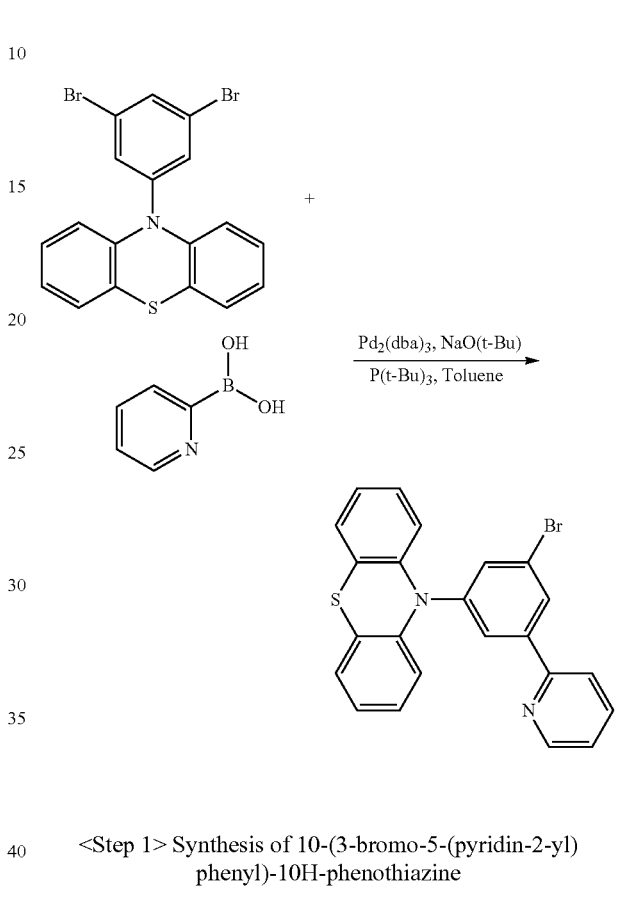

<Step 1> Synthesis of 10-(3-bromo-5-(pyridin-2-yl)phenyl)-10H-phenothiazine 10-(3,5-dibromophenyl)-10H-phenothiazine (10 g, 23.21 mmol), 2-pyridinyl boronic acid (3.43 g, 27.85 mmol), Pd(PPh$_3$)$_4$ (0.54 g, 0.46 mmol) and sodium carbonate (7.38 g, 69.62 mmol) were suspended in a mixed solvent of 400 ml of toluene and 100 ml of ethanol and then the mixture was stirred while refluxing for 12 hr.

After the completion of the reaction, the reaction product was extracted with dichloromethane and then purified by silica gel column chromatography (Hexane:MC=4:1 (v/v)) to obtain the title compound (6.38 g, yield 64%).

GC-Mass (theoretical value: 431.35 g/mol, measured value: 432 g/mol).

<Step 2> Synthesis of Compound Inv-13

11.56 g (yield 86%) of the desired title compound Inv-13 was obtained in the same manner as in Synthetic Example 1, except that 10 g (23.26 mmol) of the compound synthesized in <Step 1> was used.

$^1$H NMR: 6.61 (t, 2H), 6.72 (s, 1H), 6.95 (m, 6H), 7.01 (dd, 1H), 7.11 (s, 1H), 7.37 (m, 4H), 7.79 (m, 4H), 8.10 (m, 3H), 8.49 (t, 1H), 8.91 (t, 2H), 9.12 (s, 1H).

GC-Mass (theoretical value: 578.18 g/mol, measured value: 579 g/mol).

Synthetic Example 4

Synthesis of Inv-17

<Step 1> Synthesis of 10-(3-bromo-5-(5-phenylthiophen-2-yl)phenyl)-10H-phenothiazine

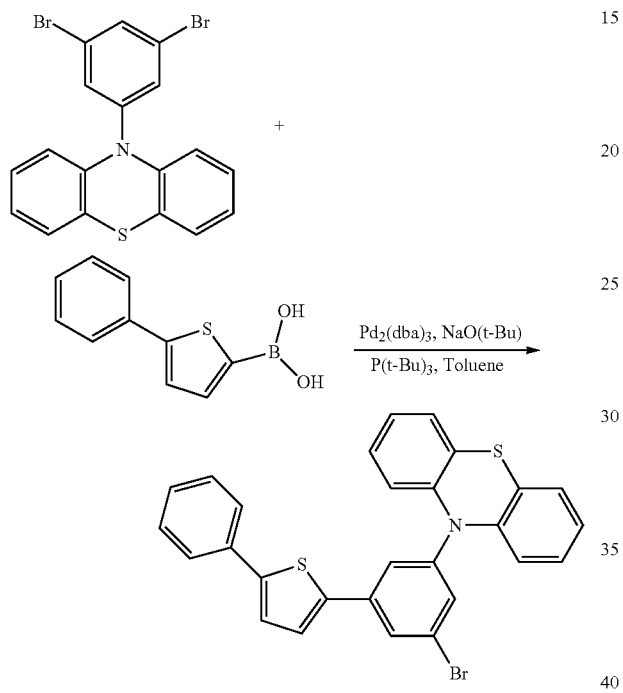

10-(3,5-dibromophenyl)-10H-phenothiazine (10 g, 23.21 mmol), 5-phenyl-2-thiophenyl boronic acid (5.68 g, 27.85 mmol), Pd(PPh$_3$)$_4$ (0.46 g, 0.46 mmol) and sodium carbonate (7.38 g, 69.62 mmol) were suspended in a mixed solvent of 400 ml of toluene and 100 ml of ethanol and then the mixture was stirred while refluxing for 12 hr.

After the completion of the reaction, the reaction product was extracted with dichloromethane and then purified by silica gel column chromatography (Hexane:MC=4:1 (v/v)) to obtain the desired title compound (7.12 g, yield 60%).

GC-Mass (theoretical value: 512.48 g/mol, measured value: 513 g/mol).

<Step 2> Synthesis of Inv-17

10.84 g (yield 84%) of the desired title compound Inv-17 was obtained in the same manner as in Synthetic Example 1, except that 10 g (19.57 mmol) of the compound synthesized in <Step 1> was used.

$^1$H NMR: 6.58 (s, 1H), 6.60 (s, 1H), 6.63 (t, 2H), 6.98 (m, 6H), 7.01 (d, 2H), 7.09 (s, 1H), 7.51 (dd, 3H), 7.86 (m, 6H), 8.13 (m, 3H), 8.29 (s, 1H), 8.91 (m, 3H).

GC-Mass (theoretical value: 659.17 g/mol, measured value: 660 g/mol).

Synthetic Example 5

Synthesis of Inv-24

<Step 1> Synthesis of 10-(4-bromophenyl)-10H-phenothiazine

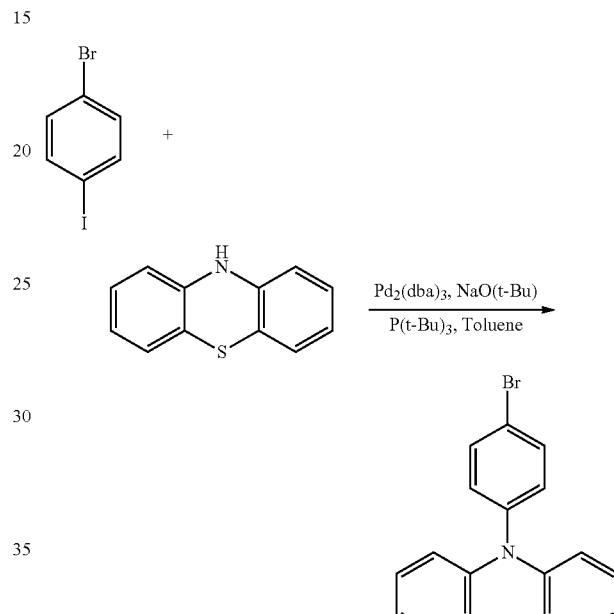

1-bromo-4-iodobenzene (37.55 g, 120.43 mmol), 10-phenothiazine (15.0 g, 75.27 mmol), sodium t-butoxide (21.70 g, 225.81 mmol) and 1.83 ml (7.53 mmol) of tri-t-butylphosphine were dissolved in 400 ml of toluene, Pd$_2$(dba)$_3$ (1.38 g, 1.51 mmol) was added thereto, and then the mixture was stirred while refluxing for 12 hr.

After the completion of the reaction, the reaction product was extracted with dichloromethane and then purified by silica gel column chromatography (Hexane:MC=4:1 (v/v)) to obtain 21.3 g (yield 80%) of the title compound.

$^1$H NMR: 6.32 (d, 2H), 6.60 (t, 2H), 6.85 (m, 4H), 7.01 (d, 2H), 7.19 (d, 2H).

GC-Mass (theoretical value: 352.99 g/mol, measured value: 353 g/mol).

<Step 2> Synthesis of Inv-24

10.84 g (yield 84%) of the desired title compound Inv-24 was obtained in the same manner as in Example 1, except that 10 g (28.33 mmol) of the compound synthesized in <Step 1> was used.

$^1$H NMR: 6.64 (m, 4H), 6.87 (t, 2H), 6.99 (m, 6H), 7.83 (m, 4H), 8.02 (d, 1H), 8.15 (m, 3H), 8.84 (t, 2H), 9.13 (s, 1H).

GC-Mass (theoretical value: 501.16 g/mol, measured value: 502 g/mol).

Synthetic Example 6

Synthesis of Inv-32

<Step 1> Synthesis of 10-(6-bromopyridin-2-yl)-10H-phenothiazine

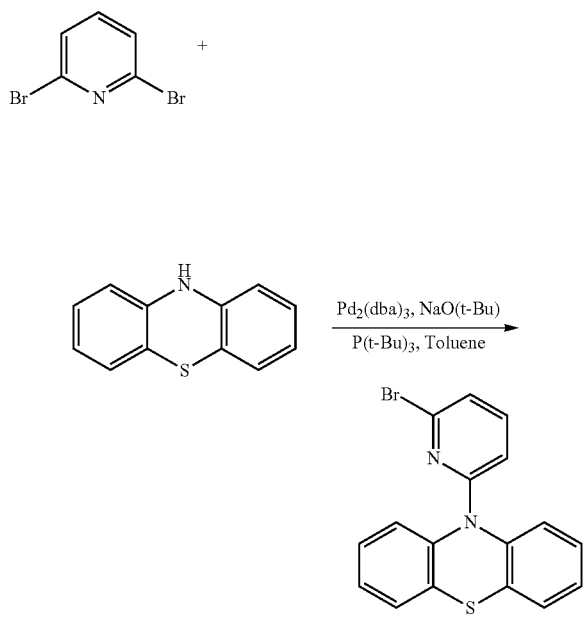

2,6-dibromo pyridine (28.28 g, 120.43 mmol), 10H-phenothiazine (15.0 g, 75.27 mmol), sodium t-butoxide (21.70 g, 225.81 mmol) and tri-t-butylphosphine (1.83 ml, 7.53 mmol) were dissolved in 400 ml of toluene, $Pd_2(dba)_3$ (1.38 g, 1.51 mmol) was added thereto, and then the mixture was stirred while refluxing for 12 hr.

After the completion of the reaction, the reaction product was extracted with dichloromethane and then purified by silica gel column chromatography (Hexane:MC=4:1 (v/v)) to obtain 18.1 g (yield 68%) of the title compound.

$^1$H NMR: 6.67 (t, 1H), 6.71 (d, 2H), 6.88 (m, 3H), 6.98 (m, 4H), 7.53 (dd, 1H).

GC-Mass (theoretical value: 353.98 g/mol, measured value: 354 g/mol).

<Step 2> Synthesis of Inv-32

10.78 g (yield 76%) of the desired title compound Inv-32 was obtained in the same manner as in Synthetic Example 1, except that 10 g (28.25 mmol) of the compound synthesized in <Step 1> was used.

$^1$H NMR: 6.30 (d, 1H), 6.68 (t, 2H), 6.76 (d, 1H), 6.98 (m, 6H), 7.14 (t, 1H), 7.84 (m, 4H), 8.13 (d, 2H), 8.23 (d, 1H), 8.54 (d, 1H), 8.92 (d, 2H), 9.57 (s, 1H).

GC-Mass (theoretical value: 353.98 g/mol, measured value: 354 g/mol).

Synthetic Example 7

Synthesis of Inv-35

<Step 1> Synthesis of 10-(4,6-dichloro-1,3,5-triazin-2-yl)-10H-phenothiazine

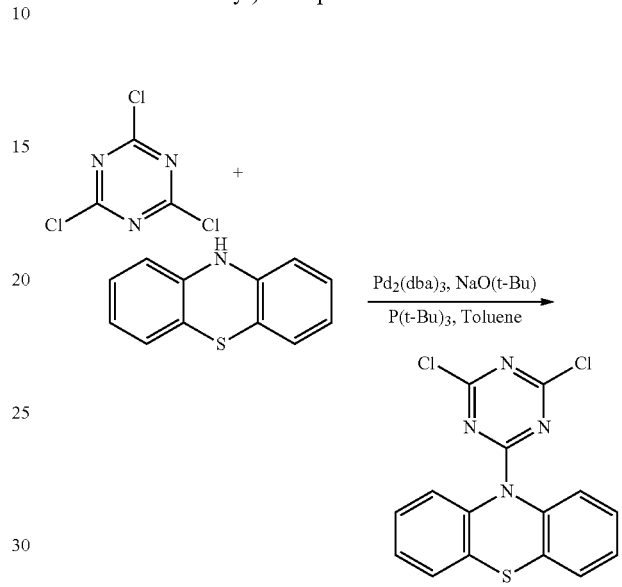

2,4,6-trichloro-1,3,5-triazine (22.21 g, 120.43 mmol), 10H-phenothiazine (15.0 g, 75.27 mmol), sodium t-butoxide (21.70 g, 225.81 mmol) and 1.83 ml (7.53 mmol) of tri-t-butylphosphine were dissolved in 400 ml of toluene, $Pd_2(dba)_3$ (1.38 g, 1.51 mmol) was added thereto, and then the mixture was stirred while refluxing for 12 hr.

After the completion of the reaction, the reaction product was extracted with dichloromethane and then purified by silica gel column chromatography (Hexane:MC=4:1 (v/v)) to obtain 16.1 g (yield 62%) of the title compound.

$^1$H NMR: 6.61 (t, 2H), 6.83 (t, 2H), 6.95 (m, 4H).

GC-Mass (theoretical value: 345.98 g/mol, measured value: 346 g/mol).

<Step 2> Synthesis of 10-(4-chloro-6-phenyl-1,3,5-triazin-2-yl)-10H-phenothiazine

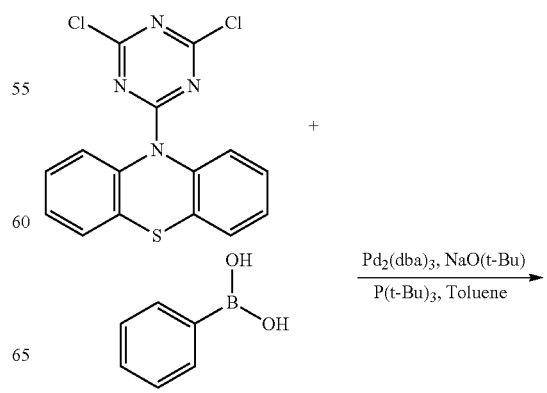

-continued

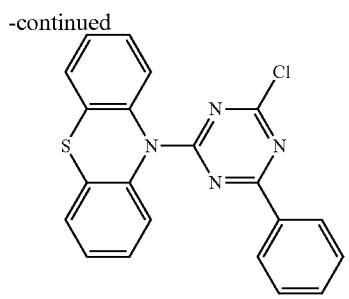

The compound (10 g, 28.90 mmol) synthesized in <Step 1>, phenyl boronic acid (4.23 g, 34.68 mmol), Pd(PPh₃)₄ (0.67 g, 0.58 mmol) and sodium carbonate (9.19 g, 86.71 mmol) were suspended in a mixed solvent of 400 ml of toluene and 100 ml of ethanol and then the mixture was stirred while refluxing for 12 hr.

After the completion of the reaction, the reaction product was extracted with dichloromethane and then purified by silica gel column chromatography (Hexane:MC=4:1 (v/v)) to obtain the title compound (6.51 g, yield 58%).

GC-Mass (theoretical value: 388.87 g/mol, measured value: 389 g/mol).

<Step 3> Synthesis of Compound Inv-35

11.81 g (yield 79%) of the desired title compound Inv-35 was obtained in the same manner as in Synthetic Example 1, except that 10 g (25.77 mmol) of the compound synthesized in <Step 2> was used.

$^1$H NMR: 6.67 (t, 2H), 6.96 (m, 6H), 7.51 (m, 3H), 7.80 (m, 4H), 8.13 (m, 3H), 8.33 (m, 3H), 8.92 (m, 3H).

GC-Mass (theoretical value: 580.17 g/mol, measured value: 581 g/mol).

Synthetic Example 8

Synthesis of Inv-50

<Step 1> Synthesis of 10-(3,5-dibromophenyl)-10H-phenothiazine

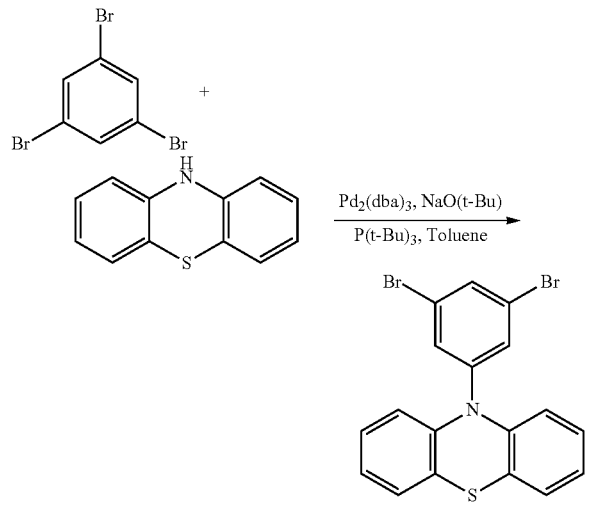

1,3,5-tribromo benzene (51.89 g, 120.43 mmol), 10H-phenothiazine (15.0 g, 75.27 mmol), sodium t-butoxide (21.70 g, 225.81 mmol) and 1.83 ml (7.53 mmol) of tri-t-butylphosphine were dissolved in 400 ml of toluene, Pd₂(dba)₃ (1.38 g, 1.51 mmol) was added thereto, and then the mixture was stirred while refluxing for 12 hr.

After the completion of the reaction, the reaction product was extracted with dichloromethane and then purified by silica gel column chromatography (Hexane:MC=4:1 (v/v)) to obtain 16.5 g (yield 51%) of the title compound.

$^1$H NMR: 6.59 (d, 2H), 6.87 (d, 2H), 6.91 (m, 4H), 7.08 (s, 1H).

GC-Mass (theoretical value: 430.90 g/mol, measured value: 431 g/mol).

<Step 2> Synthesis of Compound Inv-50

13.16 g (yield 78%) of the desired title compound Inv-50 was obtained in the same manner as in Synthetic Example 1, except that 10 g (23.21 mmol) of the compound synthesized in <Step 1> was used.

$^1$H NMR: 6.58 (s, 2H), 6.67 (t, 2H), 6.95 (m, 6H), 7.01 (s, 1H), 7.79 (dd, 8H), 8.10 (d, 2H), 8.51 (d, 8H), 8.60 (d, 2H), 8.76 (s, 2H).

GC-Mass (theoretical value: 727.23 g/mol, measured value: 728 g/mol).

Synthetic Example 9

Synthesis of Inv-51

<Step 1> Synthesis of 10-(6-bromonaphthalen-2-yl)-10H-phenothiazine

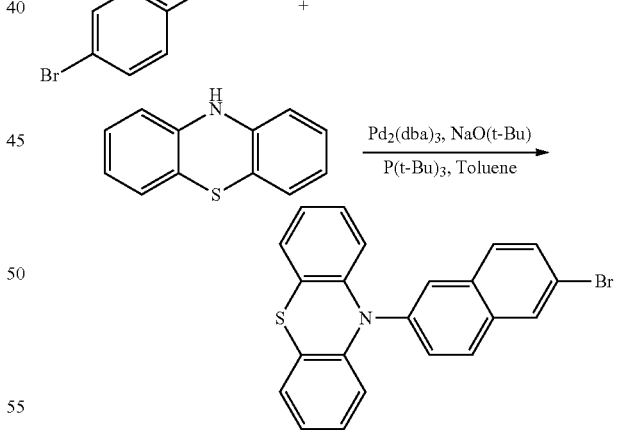

2,6-dibromo naphthalene (34.19 g, 120.43 mmol), 10H-phenothiazine (15.0 g, 75.27 mmol), sodium t-butoxide (21.70 g, 225.81 mmol) and 1.83 ml (7.53 mmol) of tri-t-butylphosphine were dissolved in 400 ml of toluene, Pd₂(dba)₃ (1.38 g, 1.51 mmol) was added thereto, and then the mixture was stirred while refluxing for 12 hr.

After the completion of the reaction, the reaction product was extracted with dichloromethane and then purified by silica gel column chromatography (Hexane:MC=4:1 (v/v)) to obtain 22.4 g (yield 74%) of the title compound.

¹H NMR: 6.57 (d, 1H), 6.61 (t, 2H), 6.69 (s, 1H), 6.89 (m, 3H), 6.96 (m, 4H), 7.32 (d, 2H), 7.81 (s, 1H).
GC-Mass (theoretical value: 403.00 g/mol, measured value: 403 g/mol).

<Step 2> Synthesis of Compound Inv-51

11.35 g (yield 83%) of the desired title compound Inv-51 was obtained in the same manner as in Synthetic Example 1, except that 10 g (24.81 mmol) of the compound synthesized in <Step 1> was used.
¹H NMR: 6.65 (t, 2H), 6.79 (m, 2H), 6.96 (m, 6H), 7.58 (m, 3H), 7.87 (m, 4H), 8.16 (m, 3H), 8.91 (m, 4H), 9.13 (s, 1H).
GC-Mass (theoretical value: 551.17 g/mol, measured value: 552 g/mol).

Synthetic Example 10

Synthesis of Inv-58

<Step 1> Synthesis of 10-(3-bromophenyl)-10H-phenothiazine

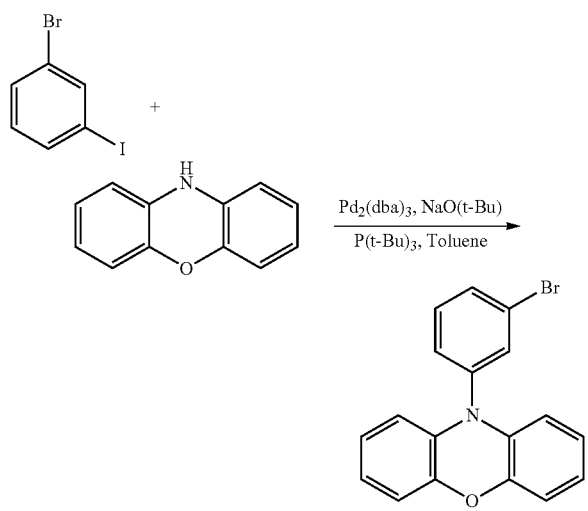

14.57 ml (114.71 mmol) of 1-bromo-3-iodobenzene, 15.0 g (81.94 mmol) of 10-phenoxazine, 23.62 g, (245.81 mmol) of sodium t-butoxide and 1.99 mL (8.19 mmol) of tri-t-butylphosphine were dissolved in 400 ml of toluene, 1.50 g (1.64 mmol) of Pd₂(dba)₃ was added thereto, and then the mixture was stirred while refluxing for 12 hr.
After the completion of the reaction, the reaction product was extracted with dichloromethane and then purified by silica gel column chromatography (Hexane:MC=4:1 (v/v)) to obtain 17.1 g (yield 62%) of the title compound.
¹H NMR: 6.28 (t, 2H), 6.49 (s, 1H), 6.65 (t, 2H), 6.81 (m, 4H), 6.96 (d, 2H), 7.25 (dd, 1H).
GC-Mass (theoretical value: 337.01 g/mol, measured value: 338 g/mol).

<Step 2> Synthesis of Compound Inv-58

10.8 g (yield 75%) of the desired title compound Inv-58 was obtained in the same manner as in Synthetic Example 1, except that 10 g (29.67 mmol) of the compound synthesized in <Step 1> was used.

¹H NMR: 6.66 (m, 4H), 6.92 (t, 2H), 6.99 (m, 5H), 7.02 (s, 1H), 7.86 (m, 4H), 8.03 (d, 1H), 8.14 (m, 3H), 8.90 (t, 2H), 9.09 (s, 1H).
GC-Mass (theoretical value: 485.18 g/mol, measured value: 485 g/mol).

Synthetic Example 11

Synthesis of Inv-59

<Step 1> Synthesis of 10-(5-bromobiphenyl-3-yl)-10H-phenoxazine

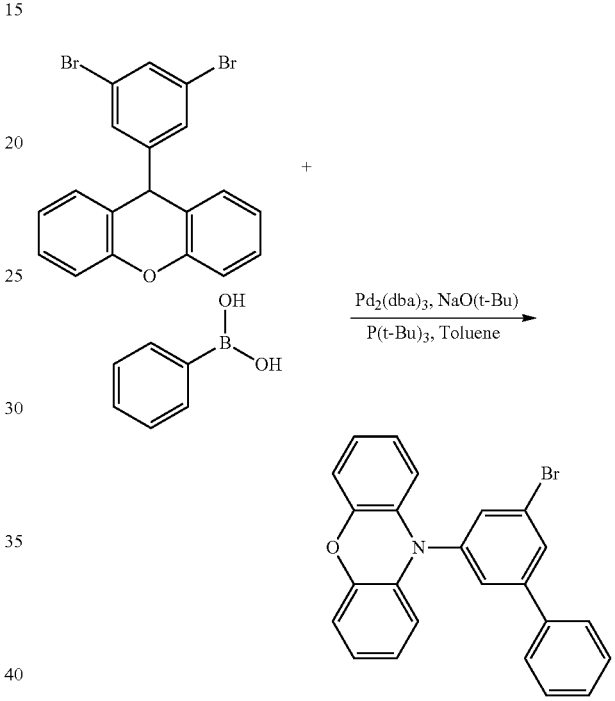

10-(3,5-dibromophenyl)-10H-phenoxazine (10 g, 24.10 mmol), 2-phenol boronic acid (3.53 g, 28.92 mmol), Pd(PPh₃)₄ (0.56 g, 0.48 mmol) and sodium carbonate (7.66 g, 72.30 mmol) were suspended in a mixed solvent of 400 ml of toluene and 100 ml of ethanol and then the mixture was stirred while refluxing for 12 hr.
After the completion of the reaction, the reaction product was extracted with dichloromethane and then purified by silica gel column chromatography (Hexane:MC=4:1 (v/v)) to obtain 6.17 g (yield 62%) of the title compound.
GC-Mass (theoretical value: 414.29 g/mol, measured value: 415 g/mol).

<Step 2> Synthesis of Compound Inv-59

10.02 g (yield 81%) of the desired title compound Inv-59 was obtained in the same manner as in Synthetic Example 1, except that 10 g (24.21 mmol) of the compound synthesized in <Step 1> was used.
¹H NMR: 6.41 (t, 2H), 6.61 (m, 4H), 6.65 (s, 1H), 6.68 (s, 1H), 6.72 (dd, 2H), 7.06 (s, 1H), 7.45 (m, 3H), 7.72 (d, 2H), 7.86 (m, 5H), 8.10 (d, 2H), 8.91 (d, 2H).

GC-Mass (theoretical value: 511.19 g/mol, measured value: 512 g/mol).

Synthetic Example 12

Synthesis of Inv-66

<Step 1> Synthesis of 10-(3-bromo-5-(phenanthren-9-yl)phenyl)-10H-phenoxazine

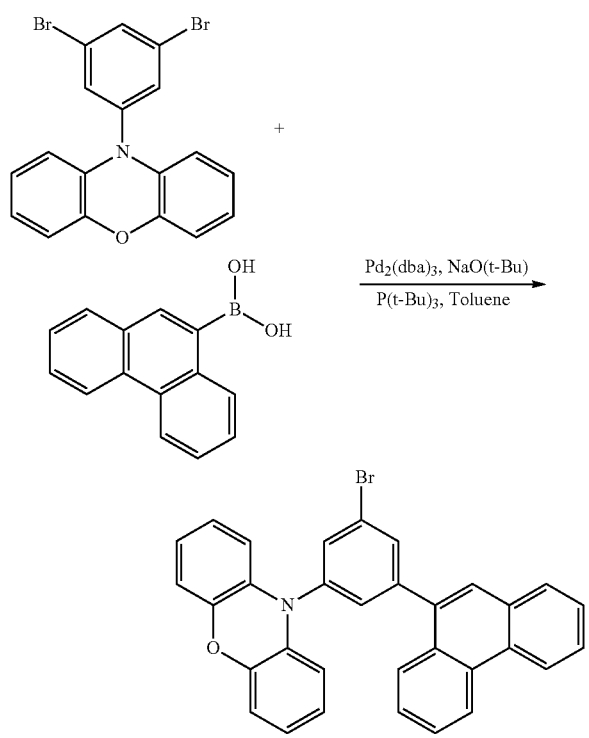

10-(3,5-dibromophenyl)-10H-phenoxazine (10 g, 24.10 mmol), phenanthrene-9-yl boronic acid (6.42 g, 28.92 mmol), Pd(PPh$_3$)$_4$ (0.56 g, 0.48 mmol) and sodium carbonate (7.66 g, 72.30 mmol) were suspended in a mixed solvent of 400 ml of toluene and 100 ml of ethanol and then the mixture was stirred while refluxing for 12 hr.

After the completion of the reaction, the reaction product was extracted with dichloromethane and then purified by silica gel column chromatography (Hexane:MC=4:1 (v/v)) to obtain 7.54 g (yield 61%) of the title compound.

GC-Mass (theoretical value: 514.41 g/mol, measured value: 515 g/mol).

<Step 2> Synthesis of Compound Inv-66 the desired title compound Inv-66 (10.95 g, yield 85%) was obtained in the same manner as in Synthetic Example 1, except that 10 g (19.49 mmol) of the compound synthesized in <Step 1> was used.

$^1$H NMR: 6.51 (m, 4H), 6.67 (dd, 2H), 7.01 (m, 5H), 7.66 (m, 9H), 8.14 (m, 5H), 8.86 (m, 6H).

GC-Mass (theoretical value: 661.24 g/mol, measured value: 662 g/mol).

Synthetic Example 13

Synthesis of 10-(2-iodophenyl)-10H-phenothiazine

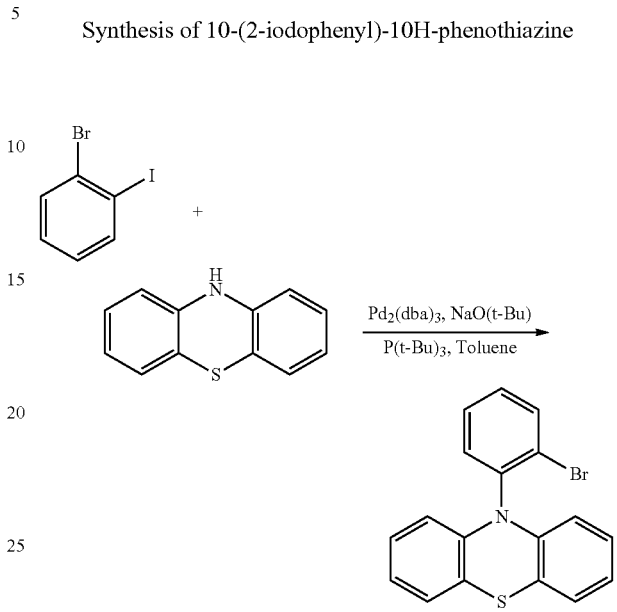

1-bromo-2-iodobenzene (37.55 g, 120.43 mmol), 10-phenothiazine (15.0 g, 75.27 mmol), sodium t-butoxide (21.70 g, 225.81 mmol) and tri-t-butylphosphine (1.83 ml, 7.53 mmol) were dissolved in 400 ml of toluene, Pd$_2$(dba)$_3$ (1.38 g, 1.51 mmol) was added thereto, and then the mixture was stirred while refluxing for 12 hr.

After the completion of the reaction, the reaction product was extracted with dichloromethane and then purified by silica gel column chromatography (Hexane:MC=4:1 (v/v)) to obtain 16.9 g (yield 72%) of the title compound.

$^1$H NMR: 6.29 (t, 1H), 6.65 (t, 2H), 6.85 (dd, 2H), 6.88 (t, 2H), 6.97 (m, 4H), 7.07 (t, 1H).

GC-Mass (theoretical value: 352.99 g/mol, measured value: 353 g/mol).

Examples 1 to 12

Manufacture of Organic EL Device

A glass substrate on which a thin film of indium tin oxide (ITO) was coated to a thickness of 1500 Å was washed with distilled water under ultrasonic wave. When the washing with distilled water is completed, the substrate was subjected to ultrasonic washing with a solvent such as isopropyl alcohol, acetone, methanol or the like and dried, and transferred to a plasma cleaner. Then, the substrate was cleaned for 5 min by using oxygen plasma, and then transferred to a vacuum evaporator.

An organic EL device of an order of NPB (40 nm)/each compound synthesized in Synthetic Examples 1 to 12+10% Ir(ppy)2(acac) (20 nm)/BCP (10 nm)/Alq3 (40 nm)/LiF (1 nm)/Al (200 nm) on the ITO transparent electrode thus prepared was manufactured.

Comparative Example 1

Manufacture of Organic EL Device

An organic EL device was manufactured in the same manner as in Example 1, except that CBP was used as a light emitting host material instead of the compound prepared in the Synthetic Example during the formation of the light emitting layer.

The structures of the NPB, CBP and Ir(ppy)2(acac) and BCP are as follows.

NPB
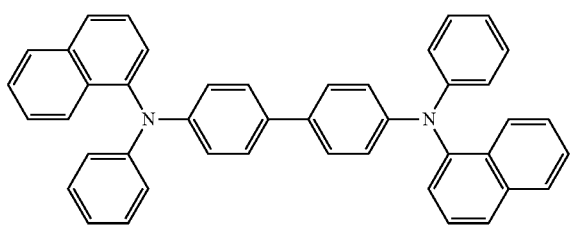

CBP
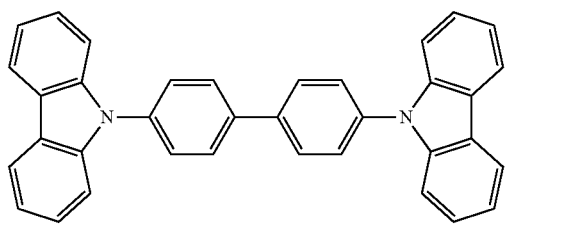

Ir(ppy)2(acac)
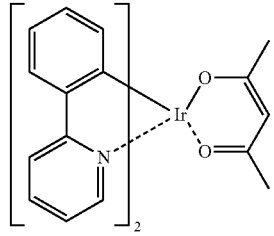

BCP
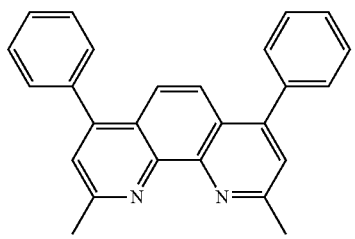

Evaluative Example

For each organic EL device manufactured in Examples 1 to 12 and Comparative Example 1, driving voltage, current efficiency and luminance were measured, and the results are shown in the following Table 1.

TABLE 1

| Sample | Driving voltage (V) | Luminance (cd/m$^2$) | Maximum current efficiency | Color |
|---|---|---|---|---|
| Inv-1 | 6.01 | 201 | 20.1 | Green |
| Inv-9 | 6.61 | 188 | 18.8 | Green |
| Inv-13 | 6.85 | 186 | 18.6 | Green |
| Inv-17 | 6.71 | 194 | 19.4 | Green |
| Inv-24 | 6.55 | 186 | 18.6 | Green |
| Inv-32 | 6.27 | 185 | 18.5 | Green |
| Inv-35 | 6.88 | 179 | 17.9 | Green |
| Inv-50 | 6.54 | 191 | 19.1 | Green |

TABLE 1-continued

| Sample | Driving voltage (V) | Luminance (cd/m$^2$) | Maximum current efficiency | Color |
|---|---|---|---|---|
| Inv-51 | 7.55 | 175 | 17.5 | Green |
| Inv-58 | 6.15 | 199 | 19.9 | Green |
| Inv-59 | 6.59 | 189 | 18.9 | Green |
| Inv-66 | 6.78 | 192 | 19.5 | Green |
| Comparative Example 1 | 7.94 | 174 | 17.4 | Green |

As can be seen from the results in Table 1, it can be confirmed that the organic EL devices (Examples 1 to 12) in which the compound according to the present invention is used show excellent performance in terms of driving voltage and luminous efficiency, compared to the organic EL device of the related art (Comparative Example 1) in which CBP is used.

Although preferred exemplary embodiments of the present invention have been described above in detail, the present invention is not limited thereto and various modifications may be made within the scope of claims and Detailed Description of Invention and this also belongs to the scope of the present invention.

The invention claimed is:

1. A compound represented by the following Formula 1:

<Formula 1>
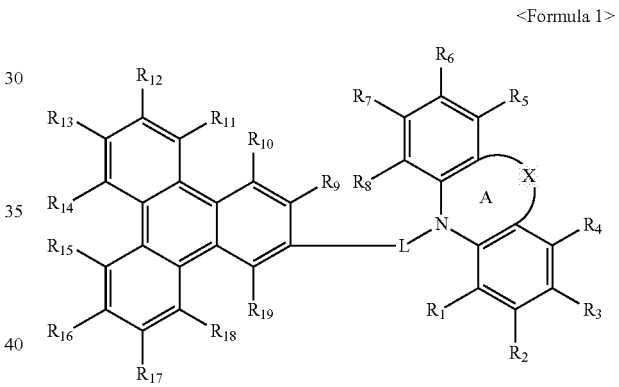

in the formula,

A means an N-containing 6- to 8-membered heterocycle;

X is selected from the group consisting of —(CR$_{20}$R$_{21}$)n-, —(SiR$_{22}$R$_{23}$)m-, —NR$_{24}$—, —O— and —S—, and n and m are each independently an integer of 1 to 3;

R$_1$ to R$_{24}$ are each independently hydrogen, deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted arylalkyl wherein aryl is C7 to C40 aryl and alkyl is C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted arylalkylamino wherein aryl is C7 to C40 aryl and alkylamino is C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and R$_1$ to R$_{23}$ may be bonded with a group adjacent to each other to form a fused aliphatic ring, a fused aromatic ring, a fused heteroaliphatic ring or a fused heteroaromatic ring; and L is a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 60 nuclear atoms, a substituted or unsubstituted C6 to C40 aryloxy, a substituted or unsubstituted arylalkyl wherein aryl is C7 to C40 aryl and alkyl is C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted arylalkylamino wherein aryl is C7 to C40 aryl and alkylamino is C1 to C40 alkylamino, a substituted or unsubstituted C3 to C20 alkylsilyl, a substituted or unsubstituted C8 to C40 arylsilyl, a substituted or unsubstituted C7 to C40 ketoaryl, or a substituted or unsubstituted C1 to C40 haloalkyl.

2. The compound as claimed in claim 1, wherein the compound represented by Formula 1 is a compound represented by the following Formula 1a, 1b or 1c:

<Formula 1a>

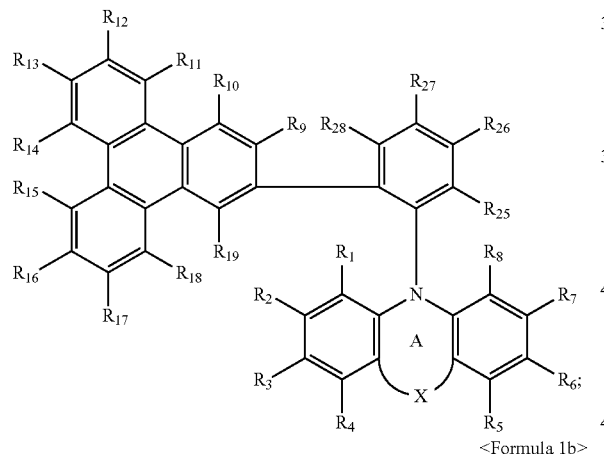

<Formula 1b>

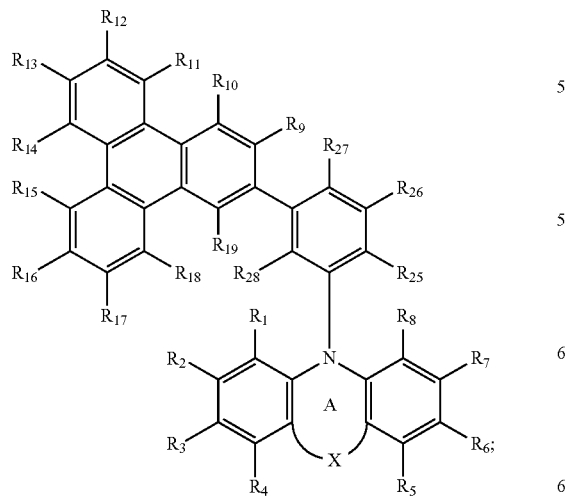

<Formula 1c> in the formula, each of A, X and $R_1$ to $R_{19}$ is the same as those as defined in claim 1, R25 to R28 are each independently hydrogen, deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted arylalkyl wherein aryl is C7 to C40 aryl and alkyl is C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted arylakylamino wherein aryl is C7 to C40 aryl and alkylamino is C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and R25 to R28 may be bonded with a group adjacent to each other to form a fused aliphatic ring, a fused aromatic ring, a fused heteroaliphatic ring or a fused heteroaromatic ring.

3. The compound as claimed in claim 1, wherein the compound represented by Formula 1 is a compound represented by the following Formula 1d:

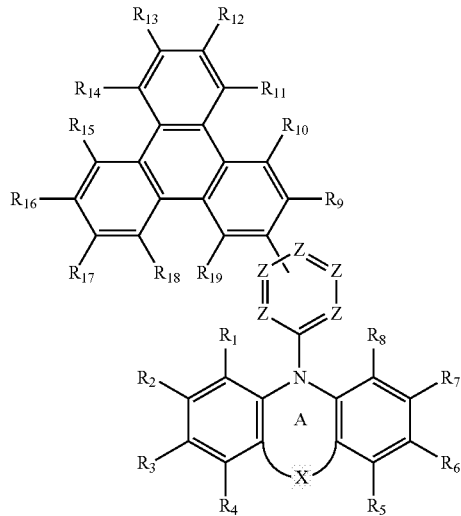

<Formula 1d> in the formula, each of A, X and $R_1$ to $R_{19}$ is the same as those as defined in claim 1, at least one of a plurality of Z's is a nitrogen atom and the rest thereof are a carbon atom, wherein if Z is carbon atom, Z is unsubstituted or substituted with deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted arylalkyl wherein aryl is C7 to C40 aryl and alkyl is C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted arylalkylamino wherein aryl is C7 to C40 aryl and alkylamino is C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and the substituent groups may be bonded with a group adjacent to each other to form a fused aliphatic ring, a fused aromatic ring, a fused heteroaliphatic ring, or a fused heteroaromatic ring.

4. An organic electroluminescent device comprising: an anode; a cathode; and one or more organic layers interposed between the anode and the cathode, wherein at least one of the organic layers comprises a compound represented by the following Formula 1;

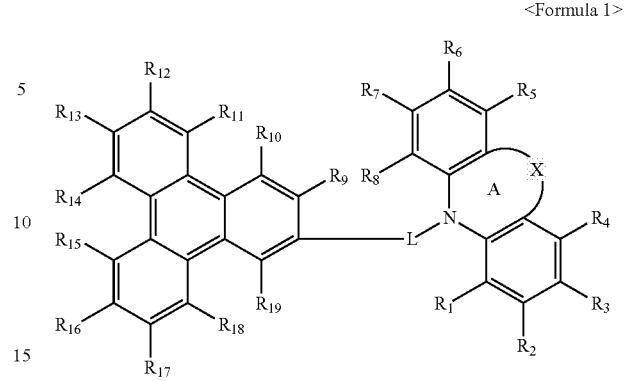

<Formula 1> in the formula,

A means an N-containing 6- to 8-membered heterocycle;

X is selected from the group consisting of —($CR_{20}R_{21}$)n-, —($SiR_{22}R_{23}$)m-, —$NR_{24}$—, —O— and —S—, and n and m are each independently an integer of 1 to 3;

$R_1$ to $R_{24}$ are each independently hydrogen, deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted arylakyl wherein aryl is C7 to C40 aryl and alkyl is C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted arylalkylamino wherein aryl is C7 to C40 aryl and alkylamino is C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and $R_1$ to $R_{23}$ may be bonded with a group adjacent to each other to form a fused aliphatic ring, a fused aromatic ring, a fused heteroaliphatic ring or a fused heteroaromatic ring; and L is a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 60 nuclear atoms, a substituted or unsubstituted C6 to C40 aryloxy, a substituted or unsubstituted arylakyl wherein aryl is C7 to C40 aryl and alkyl is C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted arylalkylamino wherein aryl is C7 to C40 aryl and alkylamino is C1 to C40 alkylamino, a substituted or unsubstituted C3 to C20 alkylsilyl, a substituted or unsubstituted C8 to C40 arylsilyl, a substituted or unsubstituted C7 to C40 ketoaryl, or a substituted or unsubstituted C1 to C40 haloalkyl.

5. The organic electroluminescent device as claimed in claim 4, wherein the organic layer is selected from the group consisting of a light emitting layer, an electron transporting layer, a hole injection layer and a hole transporting layer.

6. The organic electroluminescent device as claimed in claim 4, wherein the compound is a phosphorescent host material or a fluorescent host material.

7. The organic electroluminescent device as claimed in claim 4, wherein the compound represented by Formula 1 is a compound represented by the following Formula 1a, 1b or 1c:

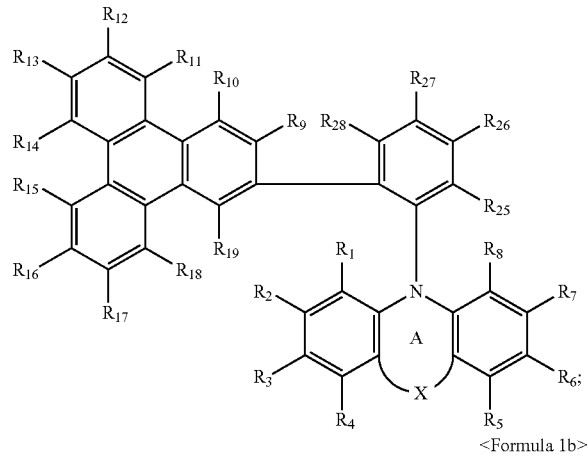

<Formula 1a>

<Formula 1b>

<Formula 1c> in the formula,
each of A, X and $R_1$ to $R_{19}$ is the same as those as defined in claim 4,
$R_{25}$ to $R_{28}$ are each independently hydrogen, deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted arylamino wherein aryl is C7 to C40 aryl and alkyl is C1 to C40 alkyl, a substituted or unsubstituted C2 to C40 alkenyl, a substituted or unsubstituted C1 to C40 alkylamino, a substituted or unsubstituted C6 to C40 arylamino, a substituted or unsubstituted arylalkylamino wherein aryl is C7 to C40 aryl and alkylamino is C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and $R_{25}$ to $R_{28}$ may be bonded with a group adjacent to each other to form a fused aliphatic ring, a fused aromatic ring, a fused heteroaliphatic ring or a fused heteroaromatic ring.

8. The organic electroluminescent device as claimed in claim 4, wherein the compound represented by Formula 1 is a compound represented by the following Formula 1d:

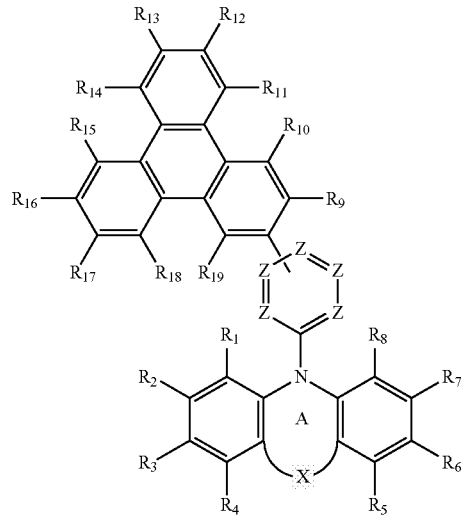

<Formula 1d> in the formula,
each of A, X and $R_1$ to $R_{19}$ is the same as those as defined in claim 4,
at least one of a plurality of Z's is a nitrogen atom and the rest thereof are a carbon atom, wherein if Z is carbon atom, Z is unsubstituted or substituted with deuterium, a halogen, a substituted or unsubstituted C1 to C40 alkyl, a substituted or unsubstituted heterocycle having 3 to 40 nuclear atoms, a substituted or unsubstituted C1 to C40 alkoxy, a substituted or unsubstituted aromatic hydrocarbon having 6 to 40 nuclear atoms, a substituted or unsubstituted C6 to C40 aryloxy, a substituted or unsubstituted arylalkyl wherein aryl is C7 to C40 aryl and alkyl is C1 to C40 alkyl, a substituted or unsubstituted C2 to C40 alkenyl, a substituted or unsubstituted C1 to

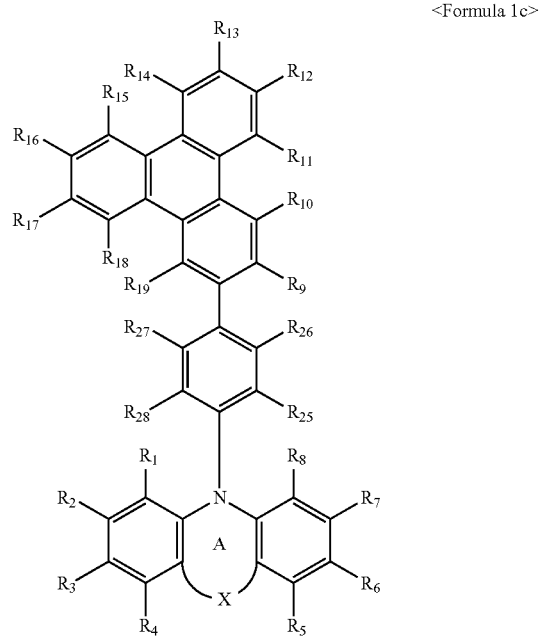

C40 alkylamino, a substituted or unsubstituted C6 to C40 arylamino, a substituted or unsubstituted arylalkylamino wherein aryl is C7 to C40 aryl and alkylamino is C1 to C40 alkylamino, a substituted or unsubstituted C3 to C20 alkylsilyl, a substituted or unsubstituted C8 to C40 arylsilyl, a substituted or unsubstituted C7 to C40 ketoaryl, a substituted or unsubstituted C1 to C40 haloalkyl, or cyano, and the substituent groups may be bonded with a group adjacent to each other to form a fused aliphatic ring, a fused aromatic ring, a fused heteroaliphatic ring or a fused heteroaromatic ring.

* * * * *